United States Patent
Katsuda et al.

(10) Patent No.: US 6,607,836 B2
(45) Date of Patent: Aug. 19, 2003

(54) MATERIAL OF LOW VOLUME RESISTIVITY, AN ALUMINUM NITRIDE SINTERED BODY AND A MEMBER USED FOR THE PRODUCTION OF SEMICONDUCTORS

(75) Inventors: Yuji Katsuda, Aichi-Prefecture (JP); Jun Yoshikawa, Aichi-Prefecture (JP); Masaaki Masuda, Aichi-Prefecture (JP); Chikashi Ihara, Aichi-Prefecture (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/982,484

(22) Filed: Oct. 18, 2001

(65) Prior Publication Data

US 2002/0110709 A1 Aug. 15, 2002

Related U.S. Application Data

(60) Provisional application No. 60/297,224, filed on Jun. 8, 2001.

(30) Foreign Application Priority Data

Oct. 23, 2000 (JP) .......................... 2000-322615
Jun. 7, 2001 (JP) .......................... 2001-173088
Sep. 4, 2001 (JP) .......................... 2001-267588

(51) Int. Cl.$^7$ .......................... C04B 35/581; H01L 23/00
(52) U.S. Cl. .......................... 428/469; 428/471; 428/697; 428/698; 428/702; 501/98.4; 501/98.6; 501/152; 501/153

(58) Field of Search .......................... 428/469, 471, 428/689, 697, 698, 702, 901, 209; 501/98.4, 98.6, 152, 153

(56) References Cited

U.S. PATENT DOCUMENTS

| | | | | |
|---|---|---|---|---|
| 4,659,611 A | * | 4/1987 | Iwase et al. | 428/209 |
| 4,766,097 A | | 8/1988 | Shinozaki et al. | 501/98 |
| 4,770,953 A | * | 9/1988 | Horiguchi et al. | 174/16.3 |
| 4,778,778 A | * | 10/1988 | Mallia et al. | 264/676 |
| 5,641,718 A | * | 6/1997 | Horiguchi et al. | 428/210 |
| 6,001,760 A | | 12/1999 | Katsuda et al. | 501/98.4 |
| 6,403,510 B1 | * | 6/2002 | Kuibira et al. | 501/98.4 |

FOREIGN PATENT DOCUMENTS

| | | | |
|---|---|---|---|
| JP | 401096067 A | * | 4/1989 |
| JP | 402080372 A | * | 3/1990 |
| JP | 407165473 A | * | 6/1995 |

* cited by examiner

Primary Examiner—Deborah Jones
Assistant Examiner—Stephen Stein
(74) Attorney, Agent, or Firm—Burr & Brown

(57) ABSTRACT

A material with a low volume resistivity at room temperature composed of an aluminum nitride sintered body is provided. The sintered body contains samarium in a converted content calculated as samarium oxide of not lower than 0.04 mole percent. The sintered body contains an aluminum nitride phase and a samarium-aluminum complex oxide phase. The samarium-aluminum complex oxide phase forms intergranular layers with a low resistivity along the intergranular phase between aluminum nitride grains.

75 Claims, 16 Drawing Sheets

(4 of 16 Drawing Sheet(s) Filed in Color)

High temperature resistivity of
added examples (representative)

MATERIAL OF LOW VOLUME RESISTIVITY, AN ALUMINUM NITRIDE SINTERED BODY AND A MEMBER USED FOR THE PRODUCTION OF SEMICONDUCTORS

This application is a non-provisional application of U.S. Provisional Application No. 60/297,224, filed Jun. 8, 2001, the entirety of which is incorporated herein by reference.

BACKGROUND OF THE INVENTION

1. Field of the Invention

The invention relates to a ceramic material of low volume resistivity, and a member for the production of semiconductors using the material.

2. Related Art Statement

An electrostatic chuck system utilizing Johnson-Rahbek effect is useful for the adsorption and retention of semiconductor wafers. In such system, the volume resistivity of the substrate of the chuck may preferably be $10^8$ to $10^{13}$ $\Omega \cdot$cm for improved adsorption force and speed of response. It is therefore desirable to control the volume resistivity of the substrate within $10^8$ to $10^{13}$ $\Omega \cdot$cm in a temperature range intended for use, in the development of an electrostatic chuck.

For example, the applicant filed a Japanese patent publication (Kokai) with a laid-open number 315867/1997 and disclosed that the volume resistivity of aluminum nitride with a high purity may be adjusted to $10^8$ to $10^{13}$ $\Omega \cdot$cm at room temperature by adding a small amount of yttrium oxide thereto.

Japanese patent publication (Kokoku) with a publication number 46032/1988 discloses a process for producing an aluminum nitride sintered body. According to the claim 1, aluminum nitride powder containing 1 weight percent of oxygen is mixed with 0.01 to 15 weight percent of the oxide of a metal element selected among yttrium, lanthanum, praseodymium, niobium, samarium, gadolinium and dysprosium to obtain mixed powder. The powder is then shaped and sintered to obtain an aluminum nitride sintered body having a high thermal conductivity and containing 0.01 to 20 weight percent of oxygen. According to "example 1" in the publication, aluminum nitride powder (with a mean particle diameter of 1 μm) containing 1 weight percent of oxygen is mixed with 3 weight percent of samarium oxide to obtain mixed powder. The powder is then subjected to hot press at a pressure of 300 kg/cm² and a temperature of 1800° C. for 1 hour to obtain a sintered body with a heat conductivity of 121 W·m/k at room temperature.

SUMMARY OF THE INVENTION

The effects of the addition of a rare earth element other than yttrium into an aluminum nitride sintered body on its volume resistivity was not studied, in the Japanese patent publication (Kokai) with a laid-open number 315867/1997. In the Japanese patent publication (Kokoku) with a publication number 46032/1988, a rare earth element is added to raw powder of aluminum nitride for improving the thermal conductivity of the resultant aluminum nitride sintered body. The effect of the addition on the volume resistivity of the sintered body was not studied.

An object of the invention is to provide a material, composed of an aluminum nitride sintered body, having a low volume resistivity of not higher than $1 \times 10^{13}$ $\Omega \cdot$cm at room temperature.

Another object of the invention is to provide an aluminum nitride sintered body having a low resistivity at room temperature.

Still another object of the invention is to provide a member used for producing semiconductors, in which the volume resistivity may be controlled depending on the application, and to prevent the contamination of semiconductors when the member is exposed to a corrosive gas.

The invention provides a material having a volume resistivity at room temperature of not higher than $1 \times 10^{13}$ $\Omega \cdot$cm (more preferably not higher than $1 \times 10^{12}$ $\Omega \cdot$cm). The material is composed of an aluminum nitride sintered body containing samarium in a converted content calculated as samarium oxide of not lower than 0.04 mole percent. The sintered body contains aluminum nitride phase and samarium-aluminum complex oxide phase.

The invention further provides an aluminum nitride sintered body containing samarium in a converted content calculated as samarium oxide of not lower than 0.04 mole percent. The sintered body contains aluminum nitride phase and $SmAl_{11}O_{18}$ phase.

The content of aluminum in the aluminum nitride sintered body should be enough for forming aluminum nitride particles as the main phase. The content may preferably be not lower than 35 weight percent, and more preferably be not lower than 50 weight percent, of the sintered body.

The inventors have found that the volume resistivity of an aluminum nitride sintered body at room temperature may be reduced to $1 \times 10^{13}$ $\Omega \cdot$cm or lower, by increasing the content of samarium as converted content calculated as the oxide to 0.04 mole percent or more and by forming aluminum nitride phase as well as samarium-aluminum complex oxide phase. Such effect of the addition of samarium on the reduction of the volume resistivity of an aluminum nitride sintered body has not been known.

Further, the inventors have studied an aluminum nitride sintered body with the reduced volume resistivity (especially the microstructure and composition) in detail. Then they found that the volume resistivity is considerably reduced when at least $SmA_{11}1O_{18}$ phase is formed in the sintered body.

The inventors have further studied the microstructure of an aluminum nitride sintered body with the reduced volume resistivity using various kinds of apparatuses described below, and found the following characteristic microstructure. Such sintered body has network microstructure made of samarium-aluminum complex oxide phase. The oxide phase is continuously formed and surrounds aluminum nitride grains in the body. It is considered that such network microstructure may contribute to the reduction of the volume resistivity.

According to the Japanese patent publication (Kokoku) with a publication number 46032/1988, 3 weight percent of samarium oxide (converted content calculated as samarium) is added to raw powder of aluminum nitride to provide mixed powder, which is then hot pressed to obtain an aluminum nitride sintered body. The publication, however, does not teach the change of the volume resistivity of the sintered body. Moreover, the publication does not teach the relationship between the precipitation of SmAl11O18 phase and the volume resistivity, as well as the network microstructure formed in the sintered body. It is considered that the discovery of the relationship and microstructure was beyond the state of art at that time.

The file of this patent contains at least one drawing executed in color. Copies of this patent with color drawing (s) will be provided by the Patent and Trademark Office upon request and payment of the necessary fee.

DETAILED DESCRIPTION OF THE INVENTION

Figure 1:
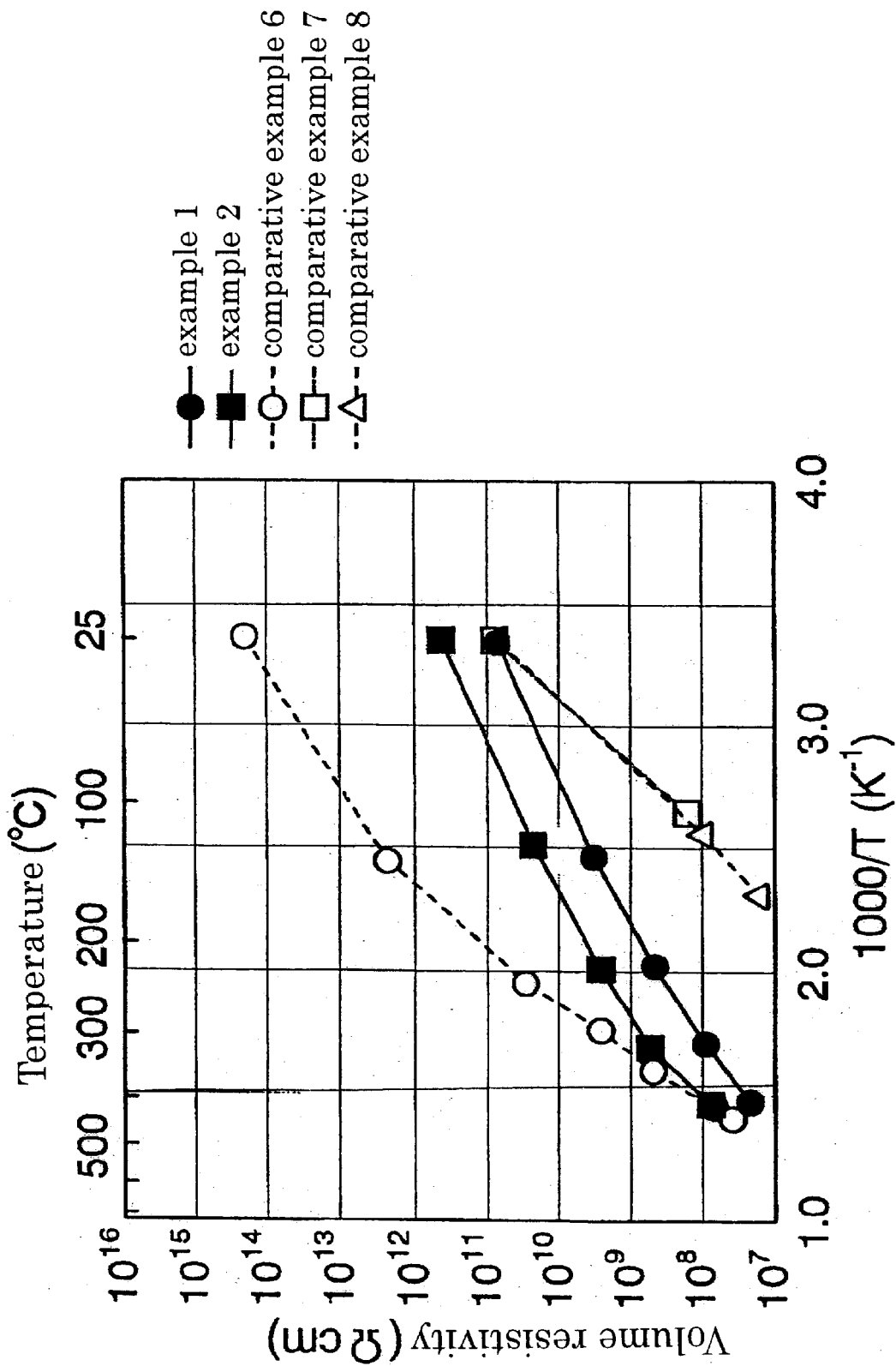
FIG. 1 is a graph showing the temperature dependency of volume resistivity of each of the sintered bodies according to examples 1, 2 and comparative examples 6, 7 and 8.

The converted content of samarium calculated as the oxide may preferably be not lower than 0.05 mole percent for obtaining the effects of the invention.

However, when the content of samarium is too large, the thermal conductivity of the inventive aluminum nitride sintered body tends to be lower. The converted content of samarium calculated as the oxide may preferably be not higher than 10 mole percent, and most preferably be not higher than 5 mole percent, for preventing the reduction of the thermal conductivity.

The aluminum nitride sintered body and material according to the invention may have a relatively low change of the volume resistivity in a higher temperature range, for example temperature range not higher than 300° C. Concretely, the activation energy of temperature dependency of volume resistivity may be adjusted to not higher than 0.4 eV from room temperature to 300° C. It is thereby possible to control the volume resistivity within a small range, preferably from $1 \times 10^{13}$ Ω·cm to $1 \times 10^{8}$ Ω·cm, in a wide temperature range from room temperature to 300° C. It is very important to reduce the temperature dependency of volume resistivity in a field of susceptor or electrostatic chuck described below.

The aluminum nitride sintered body according to the invention may have a higher strength than that of a prior aluminum nitride sintered body with a low volume resistivity. Consequently, the mechanical reliability of the sintered body may be improved. Particularly when a member for producing semiconductors is made of the sintered body according to the invention, it is possible to prevent the falling of particles from the surface of the member, thus improving the yield of the semiconductors.

The samarium-aluminum complex oxide phase may preferably contain $SmAl_{11}O_{18}$ phase and most preferably contain $SmAlO_3$ phase and $SmAl_{11}O_{18}$ phase. The phases may be identified by means of an X-ray diffraction system using conditions described in "Examples" section referring to a phase diagram.

Aluminum nitride grains in the sintered body may preferably have a mean diameter of not lower than 3 μm and not higher than 20 μm.

The inventors have further studied the contents of aluminum oxide and samarium oxide and found the following relationship. That is, the volume resistivity of the sintered body at room temperature may be further reduced by controlling the molar ratio of a Substitute specification paragraphs converted content of samarium calculated as samarium oxide to a calculated content of aluminum oxide $(Sm_2O_3/Al_2O_3)$ within 0.05 to 0.5. The content of $Sm_2O_3$ may be calculated by converting the content of samarium element in the sintered body to the content of $Sm_2O_3$. The content of $Al_2O_3$ may be calculated by the following steps. First, total content of oxygen atoms in the sintered body is obtained. Second, the content of oxygen in $Sm_2O_3$ is subtracted from the total content of oxygen to obtain the content of remaining oxygen. The content of $Al_2O_3$ is calculated under the provision that all the remaining oxygen atoms are bonded with Al atoms to form $Al_2O_3$ molecules.

Further, $(Sm_2O_3/Al_2O_3)$ may preferably be not lower than 0.08 and not higher than 0.4.

The lower limit of volume resistivity at room temperature of the inventive sintered body is not particularly limited, and preferably be not lower than $1 \times 10^7$ Ω·cm, and more preferably not lower than $1 \times 10^8$ Ω·cm.

In the invention, the phase of samarium-aluminum complex oxide may preferably be of network microstructure. The term "network microstructure" means the following condition.

The intergranular layers made of samarium-aluminum complex oxide are formed along the interfaces (intergranular phase) between aluminum nitride grains. The intergranular layers surrounding two adjacent aluminum nitride particles are continuously formed. Such network microstructure may be confirmed by EPMA.

The content of carbon in the aluminum nitride sintered body according to the invention may preferably be not higher than 0.05 weight percent.

The relative density of the aluminum nitride sintered body may preferably be not lower than 95 percent.

For providing a sintered body suited for applications in which the contamination of impurities is to be highly controlled (such as an application for producing semiconductors), the total content of metal elements excluding aluminum and all the rare earth elements (including samarium) may preferably be not higher than 100 ppm, in some cases. The total content may more preferably be not higher than 50 ppm.

In the aluminum nitride sintered body according to the invention containing a small amount of samarium, some bodies may exhibit color irregularity of red-brown to brown on their surfaces. The changes or deviations of properties corresponding with the color irregularity have not been observed. The color irregularity on the surface may, however, be undesirable from the viewpoint of preference of a customer.

The inventors have found that the volume resistivity of the sintered body may be reduced without the color irregularity on the surface, by adjusting sintering temperature from 1775 to 1825° C.

It is also possible to give a color of a low lightness (blackish color) to the surface of the aluminum nitride sintered body, by adding one or more transition metal elements selected from the group consisting of metal elements belonging to the periodic table groups IVA, VA, VIA, VIIA and VIIIA. Such color with a low lightness may be useful for reducing the color irregularity on the surface. Although such added transition metal element may be effective for reducing the lightness of the surface, the effects of the transition metal elements on the low volume resistivity and low activation energy of temperature dependency of volume resistivity have not been confirmed.

It is possible to enlarge the sintering conditions (especially temperature range) as well as to give uniform appearance, by adding the transition metal element to lower the lightness of the surface. In short, it is possible to give uniform appearance without controlling the sintering temperature within 1775 to 1825° C.

The transition metal may preferably be Ti, Zr, Hf, V, Nb, Ta, Cr, Mo, W, Mn, Fe, Co or Ni, and most preferably be Ti, Mo or W.

The transition metal element may be added to raw powder of aluminum nitride as a metal alone. The metal element may be added as a metal compound such as a metal oxide, metal nitride, metal carbide, a sulfate, nitrate and an organic metal compound. Such metal compounds are compounds forming metal oxides upon heating (precursors for forming metal oxides). The metal or metal compound may be added as powder. Further, the metal compound may be dissolved into a solvent to obtain solution, which are then added to the raw powder of aluminum nitride.

The nitride of the transition metal may preferably be present in the sintered body with a low lightness. In this case, it is preferred that the nitride may be present mainly in intergranular phase or layer between aluminum nitride grains.

The aluminum nitride sintered body may preferably have a lightness of not higher than N4 defined in "JIS Z 8721" and thereby generate a high quantity of heat radiation, thus providing excellent heating property. The sintered body may be useful for a substrate constituting a heating member such as a ceramic heater and susceptor.

The lightness will be described below. The surface color of a substance may be represented by three properties of color perception: hue, lightness and chroma. The lightness is a property for representing visual perception judging the reflectance of the surface of a substance. The representations of the three properties are defined in "JIS Z 8721". The representation of lightness will be briefly described. The lightness "V" is defined based on achromatic colors. The lightnesses of ideal black and ideal white are defined as "0" and "10", respectively. Achromatic colors between the ideal black and ideal white are divided into 10 categories and represented as symbols from "N0" to "N10". The categories are divided so that each category has a same rate or span in terms of visual perception of lightness. When actually measuring the lightness of an aluminum nitride sintered body, the surface color of the body is compared with standard color samples corresponding with "N0" to "N10" to determine the lightness of the body. The lightness is determined to the first decimal point, whose value is selected from "0" and "5".

In one preferred embodiment, the aluminum nitride sintered body contains at least 0.04 mole percent of samarium as a converted content as the oxide and further contains second rare earth element other than samarium. It is thereby possible to carry out fine adjustment (slightly increase) the volume resistivity of the sintered body of the invention. Such fine adjustment of the volume resistivity may be useful to shift the temperature range suited for the function of an electrostatic chuck to a higher temperature range. For example, it is provided that an electrostatic chuck may properly operate between room temperature to 400° C. when the chuck is made of the inventive sintered body containing no second rare earth element. It is possible to control the temperature range for the proper operation of an electrostatic chuck within 60 to 500° C., by adding the second rare earth element to the body.

However, when the content of the second rare earth element is too large, the content of $SmAlO_3$ is increased and the content of $SmAl_{11}O_{18}$ is decreased in the intergranular phase, so that the formation of the network microstructure may be interrupted. This tends to cause the increase of volume resistivity and activation energy of temperature dependency of volume resistivity. For preventing the problems, the molar ratio of a converted content of the second rare earth element "Re" calculated as rare OR; earth oxide "$Re_2O_3$" to a converted content of samarium calculated as samarium oxide ($Re_2O_3/Sm_2O_3$) may preferably be not higher than 2.0. The ratio may more preferably be not higher than 1.5 and most preferably be not higher than 1.2.

For attaining the effect of the fine control of volume resistivity by the addition of the second rare earth element, the molar ratio of a converted content of the element "Re" calculated as "$Re_2O_3$" to a converted content of samarium calculated as the oxide ($Re_2O_3/Sm_2O_3$) may preferably be not lower than 0.05 and more preferably be not lower than 0.1.

When adding the second rare earth element, the crystalline phase of the inventive sintered body is mainly composed of AlN phase and the phase of aluminum-samarium complex oxide. The complex oxide phase typically contains $SmAl_{11}O_{18}$ phase and $SmAlO_3$ phase. It is considered that the second rare earth elements are mainly dissolved into the complex oxide phase. However, phase of complex oxide of the second rare earth element "Re" and aluminum, such as $Re_3A_5O_{12}$ phase, is formed in some compositions.

As an additional effect, it may be possible to reduce the lower limit of the sintering temperature required for providing an aluminum nitride sintered body with a low volume resistivity, by adding the second rare earth element in addition to samarium. Further, the strength of the sintered body may be improved.

The second rare earth element other than samarium refers to the following sixteen elements: scandium, yttrium, lanthanum, cerium, praseodymium, neodymium, promethium, europium, gadolinium, terbium, dysprosium, holmium, erbium, thulium, ytterbium and lutetium.

The second rare earth element may preferably be one or more element selected from the group consisting of yttrium, lanthanum, cerium, gadolinium, dysprosium, erbium and ytterbium. In particular, it is possible to reduce the sintering temperature, to slightly increase the volume resistivity, to produce smaller grains and to give a larger strength by adding ytterbium, dysprosium or erbium. It is possible to slightly increase the volume resistivity and to give a larger strength by adding lanthanum. It is possible to slightly increase the volume resistivity by adding cerium or yttrium.

It is possible to reduce the lightness of the sintered body by adding the second rare earth element as well as $TiO_2$.

In a preferred embodiment, the molar ratio of total of converted contents of all the rare earth elements "Re" (including samarium) calculated as the oxides to a calculated content of aluminum oxide ($Re_2O_3/Al_2O_3$) is 0.05 to 0.5. It is thereby possible to considerably reduce the volume resistivity of the sintered body at room temperature. The ratio ($Re_2O_3/Al_2O_3$) may preferably be not lower than 0.1 and more preferably be not higher than 0.4.

The raw material of aluminum nitride may be produced by various processes, including direct reduction, reduction nitriding and gaseous phase synthesis from an alkyl aluminum.

Samarium oxide may be added to the raw material of aluminum nitride. Alternatively, a compound forming samarium oxide upon heating (a precursor of samarium oxide) may be added to the raw material of aluminum nitride. The precursor includes samarium nitrate, samarium sulfate and samarium oxalate. The precursor may be added as powder. Alternatively, a compound such as samarium nitrate or samarium sulfate may be dissolved into a solvent to obtain solution, which is then added to the raw material. It is possible to uniformly disperse samarium atoms between aluminum nitride particles, by dissolving the precursor of samarium oxide into a solvent.

The raw material may be shaped by any known methods including dry press, doctor blade, extrusion, casting and tape forming methods.

When adding the second rare earth element, the oxide of the second rare earth element may be added to the raw material of aluminum nitride. Alternatively, the compound of the rare earth element, including the nitrate, sulfate and alkoxide, may be dissolved into a solvent which may dissolve the compound. The thus obtained solution may be added to the raw material. It is thereby possible to uniformly disperse atoms of the second rare earth element in each region of the sintered body, even when an amount of the added rare earth element is very small.

In a formulating step, raw powder of aluminum nitride may be dispersed in a solvent, into which the rare earth element may be added in a form of powder of the rare earth oxide or the solution described above. In a mixing step, it is possible to simply agitate the formulation. When the raw powder contains aggregates, it is possible to use a mixing and grinding machine, such as a pot mill, trommel and attrition mill, for grinding the aggregates. When using an additive soluble in a solvent for grinding, it is enough to carry out the mixing and grinding step for a short (minimum) time required for the grinding the particles. Further, a binder component, such as polyvinyl alcohol, may be added.

The solvent used for the mixing step may be dried, preferably by spray dry method. After carrying out vacuum drying process, the particle distribution of the dried particles may preferably be adjusted by passing the particles through a mesh.

In a shaping step of the powdery material, the material may be pressed using a mold to provide a disk-shaped body. The pressure for pressing raw material is not particularly limited, as long as the shaped body may be handled without causing any fracture. The pressure may preferably be not lower than 100 $kgf/cm^2$. The powdery material may be supplied into a die for hot pressing without particularly shaping the powdery material.

The sintered body according to the invention may preferably be produced by hot pressing a body to be sintered, preferably at a pressure of not lower than 50 $kgf/cm^2$.

The sintered body according to the invention may preferably be used for various members in a system for producing semiconductors, such as systems for treating silicon wafers and for manufacturing liquid crystal displays.

The invention further provides a member used for producing semiconductors. At least a part of the member is composed of an aluminum nitride sintered body containing aluminum nitride as its main component and samarium.

Samarium has the effect of controlling the volume resistivity of an aluminum nitride sintered body as described above. It is therefore useful for controlling the volume resistivity of a member for producing semiconductors depending on the specifications required for the members. Samarium atoms contained in the sintered body might produce samarium halide when the body is exposed to a halogen series corrosive gas. The samarium halide, however, has a high melting point and a very low vapor pressure at a high temperature. It is thereby possible to reduce or prevent the contamination of semiconductors when a member for producing semiconductors is exposed to a corrosive gas (especially a halogen series corrosive gas), by forming at least a part of the member by the inventive sintered body.

The member for producing semiconductors according to the invention may preferably be an anti-corrosion member, such as a susceptor for a system for producing semiconductors. The inventive member is also suitable for an article having the above anti-corrosion member and a metal member embedded within the anti-corrosion member. Such anti-corrosion member includes a susceptor, a ring and a dome set in a system for producing semiconductors. A resistance heating element, an electrode for an electrostatic chuck and an electrode for generating high-frequency wave may be embedded within the susceptor.

The sintered body according to the invention has a low volume resistivity as described above, and therefore suitable as a substrate of an electrostatic chuck. An electrostatic chuck electrode is embedded within the substrate of the chuck. It is possible to further embed a resistance heating element, an electrode for generating plasma or the like within the substrate.

Especially in an electrostatic chuck utilizing Johnson-Rahbek effect, it is desirable to control the volume resistivity of a substrate of the electrostatic chuck not higher than $1 \times 10^{13}$ Ω·cm and not lower than $1 \times 10^8$ Ω·cm, for improving its adsorption force and speed of response. An aluminum nitride sintered body has high anti-corrosion property against a halogen gas and thus suitable as a member for producing semiconductors. The applicant has produced aluminum nitride sintered bodies having volume resistivities near $10^{10}$ Ω·cm at room temperature. The applicant has filed an aluminum nitride sintered body with a small amount of $Y_2O_3$ added (Japanese patent laid open publication (Kokai)

with a laid-open number 315867/1997) and another sintered body with a small amount of $CeO_2$ (Japanese patent laid open publication (Kokai) with a laid-open number 232598/2000). Each of the sintered bodies has a relatively large temperature dependency of volume resistivity, and therefore may be used as a substrate of an electrostatic chuck only in a relatively small temperature range of about 100° C.

The sintered body according to the invention has a small temperature dependency of volume resistivity as described above. It is thereby possible to control the volume resistivity not higher than $1 \times 10^{13}$ Ω·cm and not lower than $1 \times 10^8$ Ω·cm in a wider temperature range, for example, from room temperature to 300° C. Such electrostatic chuck having a substrate made of the inventive sintered body may be used in a wider temperature range while preserving its anti-corrosion property, without the necessity of substitution with another kind of an electrostatic chuck.

EXAMPLES (Experiment "A")

Aluminum nitride bodies were produced and their properties were evaluated as described below.

(1) Production of Mixed Powder of Aluminum Nitride and Samarium Oxide 4 types of AlN raw powdery materials were used, including 2 kinds "A" and "B" of commercial materials produced by reduction nitriding and 2 kinds of materials "C" and "D" produced by gaseous phase synthesis. "A" contains 0.97 weight percent of oxygen, "B" contains 0.87 weight percent of oxygen, "C" contains 0.44 weight percent of oxygen and "D" contains 1.20 weight percent of oxygen. A commercial powder of samarium oxide with a purity of not lower than 99.9 percent and a mean particle diameter of 1.1 $\mu$m was used.

Each powder was weighed as shown in tables 1 and 4. Each weighed powder was then subjected to wet blending using isopropyl alcohol as a solvent, a nylon pot and nylon media for 4 hours to obtain slurry. After the blending, the slurry was collected and dried at 110° C. The thus dried powder was then subjected to heat treatment in an atmosphere at 450° C. for 5 hours to remove carbon content contaminated during the wet blending to produce raw mixed powder. In the columns of "ratio (mol %)" of the mixed powder, the ratios of AlN powder and $Sm_2O_3$ powder were calculated ignoring the content of impurities.

(2) Shaping and Sintering Steps

Each mixed powder was then shaped by means of uniaxial pressing at a pressure of 200 kgf/cm² to obtain a disk-shaped body with a diameter of 100 mm and a thickness of 20 mm, which was then contained within a mold made of graphite for sintering.

Each shaped body was sintered by hot pressing at a pressure of 200 kgf/cm² and a temperature of 1700 to 1900° C. for 4 hours and then cooled. During the sintering, the shaped body was set in vacuum from room temperature to 1000° C. and then nitrogen gas was introduced at a pressure of 1.5 kgf/cm² from 1000° C. to each sintering (maximum) temperature shown in the tables.

(3) Evaluation

The thus obtained sintered bodies were processed and then subjected to the following evaluation.

(Density, Open Porosity)

They are measured by Archimedes method using water as a medium.

(Contents of Metal Elements)

They are determined by inductively coupled plasma (ICP) spectrometry.

(Content of Sm2O3)

The content of Sm is determined by ICP spectrometry and then converted to the content of Sm2O3.

(Oxygen Content)

It is determined by inert gas melting infrared absorptiometry analysis method.

(Carbon Content)

It is determined by high frequency heating infrared absorptiometry analysis method.

(Content of Al2O3)

The total content of oxygen in the sintered body is obtained. The oxygen content in Sm2O3 was then subtracted from the total content of oxygen to calculate the remaining oxygen. The content of Al2O3 was calculated under the provision that all the remaining oxygen atoms constitute Al2O3.

(Content of AlN)

The contents of Sm2O3 and Al2O3 calculated as described above are subtracted from 100 mole percent to provide the content of AlN. This calculation is performed under the provision that total of the contents of AlN, Sm2O3 and $Al_2O3$ is 100 mole percent.

(Crystalline Phase)

It is determined by using a rotating anode type X-ray diffraction system "RINT" M supplied by "Rigaku Denki" under the following condition: CuKα, 50 kV, 300 mA, and 2θ=20 to 70°.

(Volume Resistivity)

It is measured by a method according to "JIS C 2141" from room temperature to about 400° C. under vacuum. The test sample has the following parts: a plate with 50 mm×50 mm×1 mm; a main electrode with a diameter of 20 mm; a guard electrode with an inner diameter of 30 mm and outer diameter of 40 mm; and an applying electrode with a diameter of 45 mm. The electrodes are formed of silver. 500 V/mm of voltage is applied and a current is read one minute after the application of voltage so that the volume resistivity is calculated.

(Activation Energy)

An activation energy (Ea) of temperature dependency of volume resistivity from room temperature to 300° C. is calculated according to the following equation.

$$\ln \sigma = A - Ea/(kT)$$

σ: electrical conductivity=1/ρ
ρ: volume resisitivity
k: Boltzman's constant
T: absolute temperature
A: a constant (Thermal Conductivity)

It is measured by laser flash method.

(Bending Strength)

A four-point bending strength at room temperature is measured according to "JIS R1601".

(Mean Grain Diameter of AlN Grains)

The sintered body was polished to form a polished surface, which was observed by an electron microscope to determine grain diameter values at 30 points in a visual field. The average of the 30 values was calculated.

(Observation of Microstructure)

The distribution of each element was analyzed by EPMA.

The results of the evaluation of the sintered bodies will be explained.

(1) Example 1

Refer to Tables 1 and 2

The above AlN powder "A" was used. 0.235 mole percent of $Sm_2O_3$ was added to the AlN powder to obtain raw mixed powder, which was sintered at 1800° C. to provide a dense body with a density of 3.30 g/cm$^3$ and an open porosity of 0.04 percent.

The contents of oxygen, Sm and carbon in the sintered body were shown in table 1. The molar ratio of a converted content of Sm calculated as $Sm_2O_3$ to a calculated content of aluminum oxide ($Sm_2O_3/Al_2O_3$) was 0.258.

The volume resistivity was 6×10$^{10}$ Ω·cm at room temperature (25° C.) and 1×10$^8$ Ω·cm at 300° C. In table 2, "6×10$^{10}$" was represented as "6E+10". The same method of representation will be applied in the following tables.

to 170° C.) in the comparative example 7 and 0.69 eV (25 to 170° C.) in the comparative example 8. The inventive sintered bodies have the activation energies considerably lower than those of the sintered bodies of comparative examples.

When a range of volume resistivity of 1E+12 to 1E+8 (1×10$^{12}$ to 1×10$^8$) Ω·cm is suitable for a substrate of an electrostatic chuck, the sintered body of the example 1 satisfies this range from −30 to 300° C. Similarly, the body of the example 2 satisfies the range from 10 to 400° C., the comparative example 6 satisfies it from 150 to 400° C. and the comparative examples 7 and 8 satisfy it from 0 to 120°

TABLE 1

| | raw powder | | sintering | properties of sintered body | | | | | |
|---|---|---|---|---|---|---|---|---|---|
| | AlN powder | | condition | chemical analysis data | | | Sm2O3 | Al2O3 | Sm2O3/ |
| type | Oxygen content weight % | Sm2O3 mol % | sintering temperature ° C. | O content wt % | Sm content wt % | C content wt % | converted content mol % | calculated content mol % | Al2O3 molar ratio |
| example 1 | A | 0.97 | 0.23 | 1800 | 1.19 | 1.53 | 0.029 | 0.214 | 0.831 | 0.258 |
| example 2 | A | 0.97 | 0.12 | 1800 | 0.94 | 0.69 | 0.029 | 0.096 | 0.721 | 0.133 |
| example 3 | A | 0.97 | 0.35 | 1800 | 1.23 | 1.87 | 0.034 | 0.263 | 0.821 | 0.320 |
| example 4 | A | 0.97 | 0.06 | 1900 | 0.81 | 0.35 | 0.030 | 0.048 | 0.653 | 0.074 |
| example 5 | A | 0.97 | 0.23 | 1900 | 0.52 | 0.43 | 0.028 | 0.059 | 0.389 | 0.152 |
| example 6 | B | 0.87 | 0.12 | 1800 | 0.85 | 0.70 | 0.030 | 0.097 | 0.641 | 0.151 |
| example 7 | B | 0.87 | 0.23 | 1800 | 1.06 | 1.43 | 0.030 | 0.200 | 0.729 | 0.274 |
| example 8 | C | 0.44 | 0.06 | 1800 | 0.67 | 0.37 | 0.038 | 0.051 | 0.528 | 0.097 |
| example 9 | C | 0.44 | 0.12 | 1800 | 0.71 | 0.74 | 0.040 | 0.102 | 0.513 | 0.199 |
| example 10 | D | 1.20 | 0.35 | 1800 | 1.44 | 1.84 | 0.037 | 0.259 | 1.013 | 0.256 |
| comparative example 1 | A | 0.97 | 0.02 | 1800 | 0.80 | 0.16 | 0.031 | 0.022 | 0.669 | 0.033 |
| comparative example 2 | A | 0.97 | 0.06 | 1700 | 0.85 | 0.37 | 0.031 | 0.051 | 0.685 | 0.075 |
| comparative example 3 | A | 0.97 | 0.58 | 1800 | 1.52 | 3.55 | 0.034 | 0.508 | 0.856 | 0.594 |
| comparative example 4 | B | 0.87 | 0.35 | 1800 | 1.19 | 2.17 | 0.033 | 0.306 | 0.745 | 0.410 |
| comparative example 5 | C | 0.44 | 0.23 | 1800 | 0.82 | 1.50 | 0.039 | 0.209 | 0.507 | 0.412 |

TABLE 2

| | properties of sintered body | | | | | | | | |
|---|---|---|---|---|---|---|---|---|---|
| | open porosity % | bulk density g/cm3 | resistivity 25° C. Ω · cm | resistivity 300° C. Ω · cm | activation energy eV | bending strength MPa | thermal conductivity W/mK | average grain diameter of AlN | crystalline phase (excluding AlN) |
| example 1 | 0.05 | 3.30 | 6E+10 | 1E+08 | 0.35 | 370 | 101 | 4 | SmAlO3, SmAl11O18 |
| example 2 | 0.04 | 3.28 | 4E+11 | 6E+08 | 0.35 | 344 | 95 | 4 | SmAlO3, SmAl11O18 |
| example 3 | 0.02 | 3.33 | 6E+11 | 1E+09 | 0.34 | 396 | 107 | 4 | SmAlO3, SmAl11O18 |
| example 4 | 0.05 | 3.27 | 9E+10 | 2E+08 | 0.33 | 406 | 89 | 6 | SmAlO3, SmAl11O18 |
| example 5 | 0.04 | 3.27 | 1E+11 | 2E+08 | 0.34 | 399 | 120 | 6 | SmAlO3, SmAl11O18 |
| example 6 | 0.04 | 3.28 | 2E+11 | 2E+08 | 0.37 | 458 | 98 | 4 | SmAlO3, SmAl11O18 |
| example 7 | 0.02 | 3.30 | 3E+11 | 4E+08 | 0.35 | 448 | 105 | 4 | SmAlO3, SmAl11O18 |
| example 8 | 0.07 | 3.27 | 8E+11 | 9E+08 | 0.37 | 399 | 93 | 4 | SmAlO3, SmAl11O18 |
| example 9 | 0.04 | 3.28 | 7E+11 | 9E+08 | 0.36 | 388 | 100 | 4 | SmAlO3, SmAl11O18 |
| example 10 | 0.08 | 3.34 | 7E+10 | 1E+08 | 0.35 | 364 | 102 | 4 | SmAlO3, SmAl11O18 |
| comparative example 1 | 0.04 | 3.26 | 4E+15 | 1E+11 | 1.13* | 387 | 96 | 4 | SmAl11O18 |
| comparative example 2 | 0.07 | 3.27 | 3E+15 | 5E+10 | 1.14* | 368 | 97 | 2 | SmAlO3, SmAl11O18 |
| comparative example 3 | 0.05 | 3.36 | 1E+15 | 9E+10 | 1.18* | 444 | 121 | 4 | SmAlO3 |
| comparative example 4 | 0.02 | 3.32 | 3E+14 | 1E+11 | 0.88* | 440 | 111 | 4 | SmAlO3 |
| comparative example 5 | 0.03 | 3.30 | 9E+13 | 1E+09 | 1.01* | 436 | 110 | 4 | SmAlO3 |

*temperature range for measurement: 150~400° C.

FIG. 1 is a graph showing the temperature dependency of volume resistivity of the body according to example 1. FIG. 1 also shows each graph of temperature dependency of each sintered body according to each of example 2 and comparative examples 6 to 8. The activation energy is a slope of a graph showing temperature dependency of volume resistivity. The activation energy was 0.34 eV (25 to 300° C.) in the example 1, 0.35 eV (25 to 300° C.) in the example 2, 1.0 eV (150 to 400° C.) in the comparative example 6, 0.71 eV (25

C. The sintered body according to the invention may be applied to an electrostatic chuck in a temperature range considerably wider than that of a prior sintered body.

The strength, thermal conductivity and mean diameter of AlN grains were described in table 2. Particularly, the sintered body according to the invention has a strength of 370 MPa, which was higher than those of the comparative examples 7 and 8.

Figure 2:
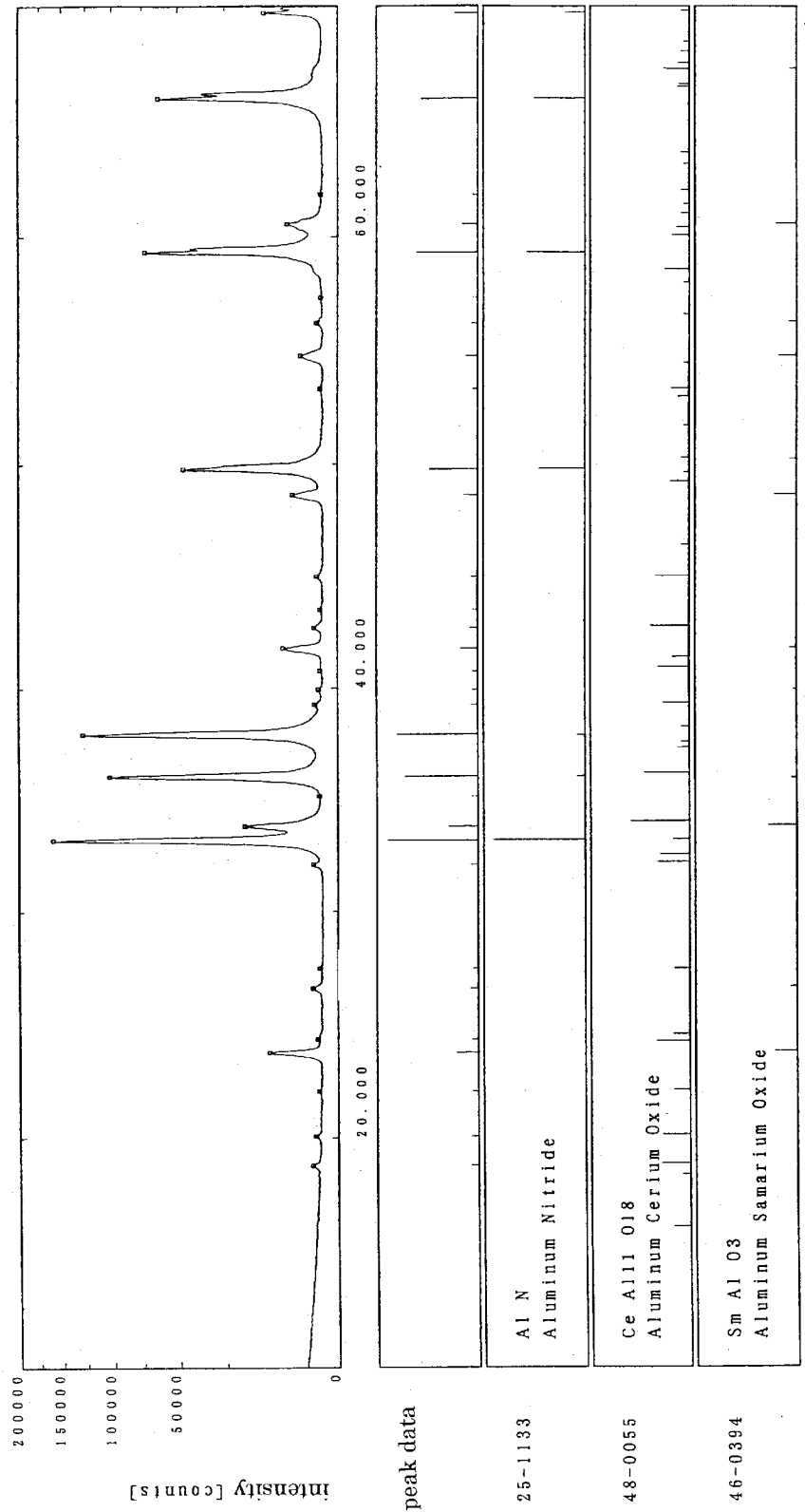
FIG. 2 is an X-ray diffraction profile of the sintered body according to the example 1.
Figure 3:
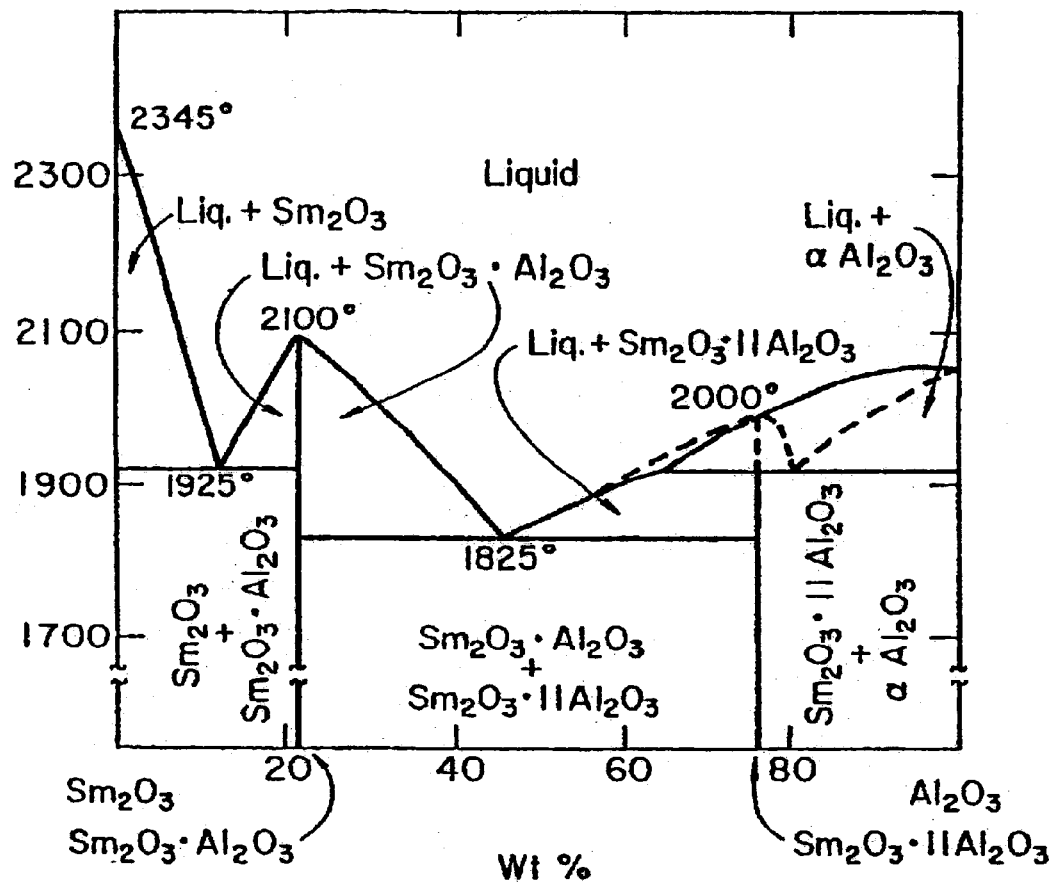
FIG. 3 is a phase diagram of alumina-samarium oxide system.

FIG. 2 shows peak profile of X-ray diffraction measurement. According to FIG. 2, AlN phase (JCPDS No. 25-1133) and SmAlO$_3$ phase (JCPDS No. 46-0394) were identified. Another phase was observed at 2θ=19, 20, 22° or the like. The peak positions of the another phase correspond with CeAl$_{11}$O$_{18}$ phase (JCPDS card No. 48-0055). The another phase was thus identified as SmAl$_{11}$O$_{18}$ phase having the same crystalline structure as CeAl$_{11}$O$_{18}$. The presence of SmAl$_{11}$O$_{18}$ phase was confirmed by a phase diagram of Sm$_2$O$_3$—Al$_2$O$_3$ system shown in FIG. 3 (Phase Diagrams for Ceramists 1975 Supplement, FIG. 4369).

Figure 4:
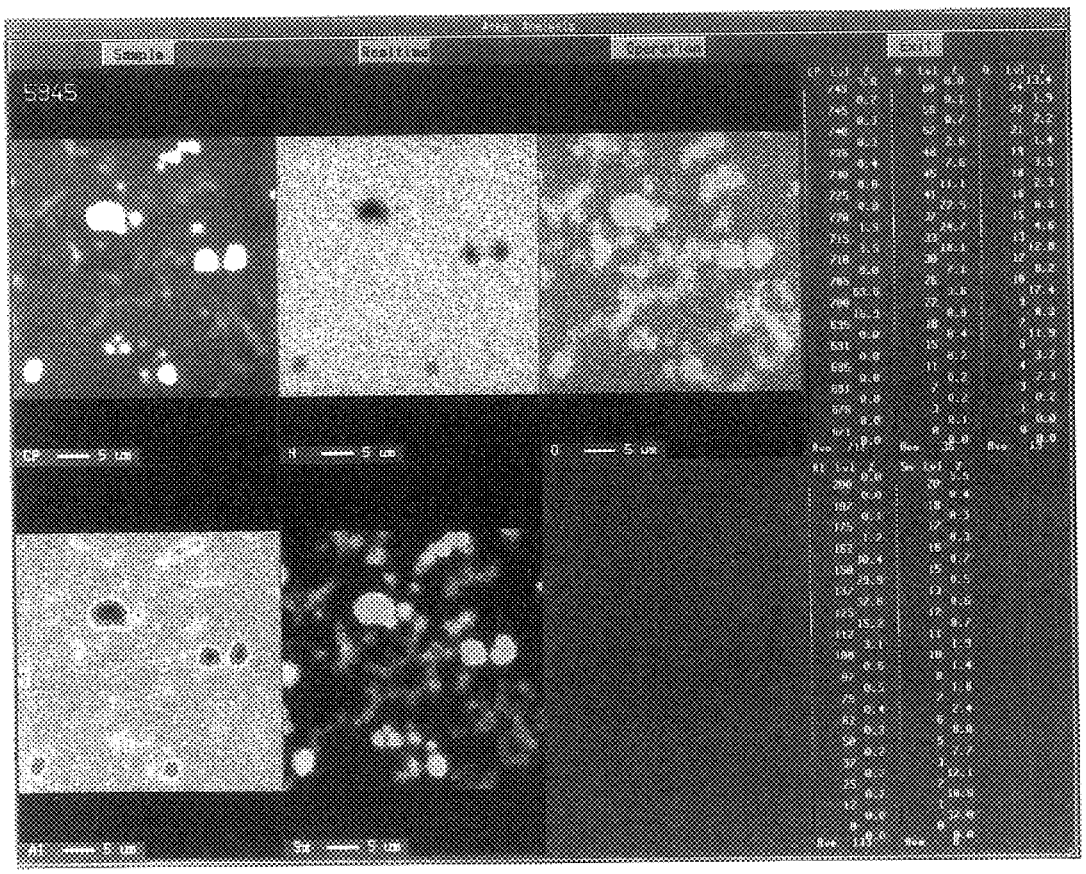
FIG. 4 shows the results of EPMA analysis of elements in the sintered body according to the example 1.
Figure 5:
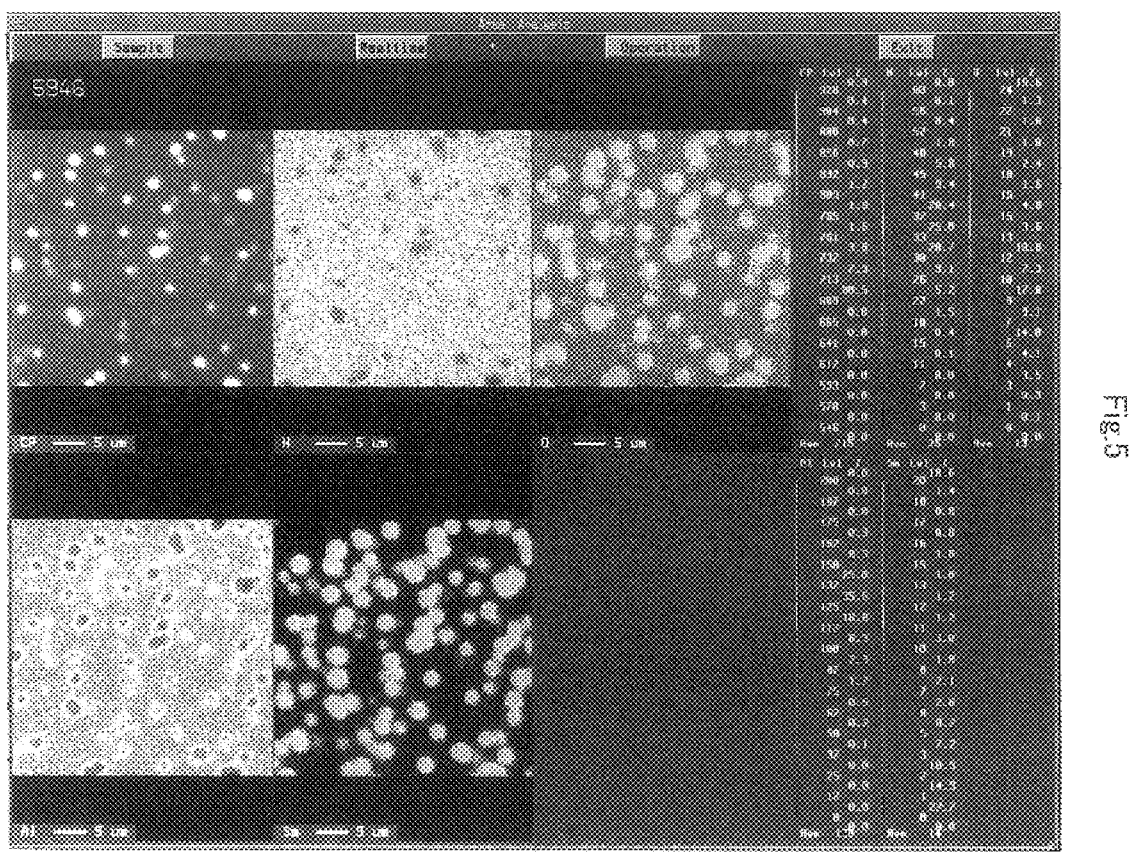
FIG. 5 shows the results of EPMA analysis of elements in the sintered body according to the comparative example 3.
Figure 6:
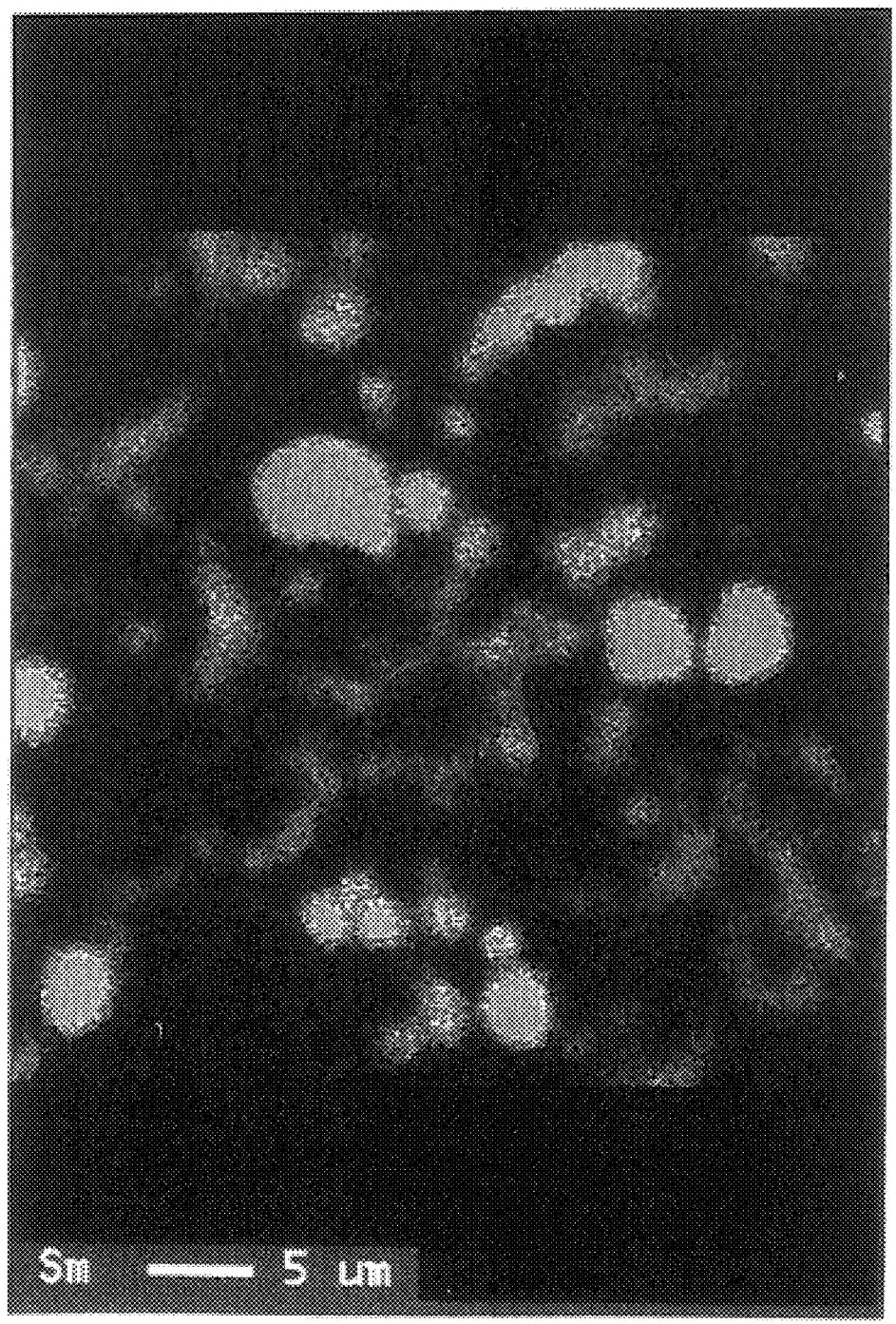
FIG. 6 shows the result of EPMA analysis of samarium in the sintered body according to the example 1.
Figure 7:
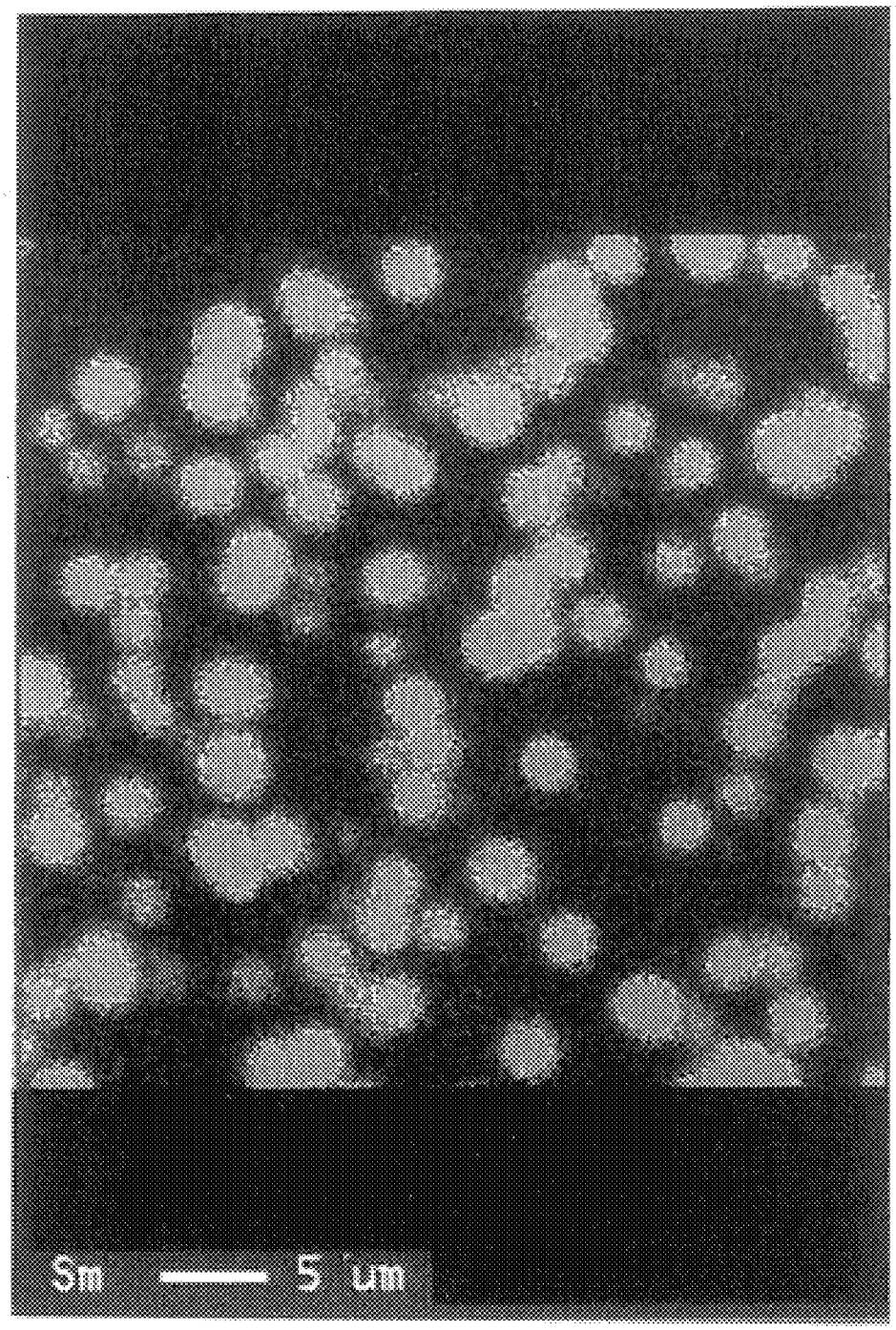
FIG. 7 shows the result of EPMA analysis of samarium in the sintered body according to the comparative example 3.

FIG. 4 shows the distribution of Sm atoms in the sintered body measured by EPMA. FIG. 5 shows the distribution of Sm atoms in the sintered body of the comparative example 3. FIGS. 4 and 5 also show the distribution of N atoms, O atoms and Al atoms. In FIGS. 4 and 5, the content of Sm atoms corresponds with the lightness in the photograph (refer to a color tone scale in the right column of the photograph). Further, FIG. 6 shows the enlarged view of the distribution of Sm atoms shown in FIG. 4, and FIG. 7 shows the enlarged view of the distribution of Sm atoms shown in FIG. 5.

As shown in FIGS. 4 and 5, Sm phase was recognized in the sintered body according to the example 1 and comparative example 3. In the Sm phase, Sm atoms were distributed between AlN matrix forming spherical entities (designated as "spherical portions"). Further in the sintered body of the example 1, characteristic elongate portions were recognized. In the elongate portions, the content of Sm element was lower compared with that in the spherical portion. In other words, the spherical portions were brighter than the elongate portions. The elongate portions were distributed within the intergranular phase between AlN grains to form a kind of network-like entities. The substances constituting the spherical and elongate portions were identified by comparing the photographs by EPMA and the results of the above X-ray diffraction measurement. Consequently, it is assumed that the spherical portions with a higher content of Sm atoms are composed of SmAlO3 and the elongate portions forming network with a lower content of Sm atoms are composed of SmA11O18. It is speculated that the volume resistivity of the sintered body is reduced by the presence of SmA11O18 phase in the intergranular layers between AlN grains, forming conductive pass.

(2) Examples 2 to 10

The manufacturing condition of each sintered body and its properties were shown in tables 1 and 2.

When the AlN powder "B", "C" or "D" was used, substantially same properties as the example 1 were obtained within a certain range of the content of Sm$_2$O$_3$. Particularly when the AlN powder "C" with a low oxygen content was used, the content of Sm$_2$O$_3$ required for attaining a low volume resistivity shifted to a lower content range. On the other hand, when the AlN powder "D" with a high oxygen content was used, the content of Sm2O3 required for attaining a low volume resistivity shifted to a higher content range. The volume resistivity of the aluminum nitride sintered body may be controlled by adjusting the molar ratio of the contents of Sm2O3 to Al2O3, in addition to the content of Sm2 O3 (molar ratio) alone.

(3) Comparative Examples 6 to 8

Table 3

The comparative example 6 was an AlN sintered body without an additive. Its volume resistivity at room temperature was high (2×10$^{14}$ Ω·cm) and the activation energy of temperature dependency was high (1.0 eV: 150 to 400° C.: refer to FIG. 1).

TABLE 3

| comparative example | raw powder | | | sintering condition | content of added | | | properties of sintered body | | | | | | | |
|---|---|---|---|---|---|---|---|---|---|---|---|---|---|---|---|
| | AlN powder | | | sintering | | | | | | | | | | thermal con | average |
| | type | oxygen content weight % | additive | temperature °C. | oxygen content weight % | metal element weight % | bulk density g/cm3 | open porosity % | resistivity 25° C. Ω·cm | resistivity 300° C. Ω·cm | activation energy eV | bending strength MPa | ductivity W/mK | ductivity W/mK | grain diameter of AlN μm |
| 6 | A | 0.97 | none | 1800 | 0.80 | — | 3.26 | 0.04 | 2E+14 | 3E+09 | 0.59* | 365 | 91 | | 3 |
| 7 | A | 0.97 | Y2O3 | 1900 | 0.84 | 0.22 | 3.27 | 0.02 | 8E+10 | <1E+7 | 0.71** | 333 | 92 | | 7 |
| 8 | A | 0.97 | CeO2 | 1900 | 0.83 | 0.37 | 3.27 | 0.03 | 7E+10 | <1E+7 | 0.69** | 312 | 100 | | 6 |

*temperature range for measurement: 150~400° C.
**temperature range for measurement: 25~170° C.

The comparative example 7 provides an AlN sintered body with a small amount of Y2O3 added and a low volume resistivity. The volume resistivity at room temperature was as low as 8×10$^{10}$ Ω·cm, and the resistivity at 300° C. was not higher than 1×10$^7$ Ω·cm. The temperature dependency of volume resistivity was, therefore, large. The activation energy of the temperature dependency was as large as 0.71 eV (25 to 170° C.).

The comparative example 8 provides an AlN sintered body with a small amount of CeO2 added and a low volume resistivity. Although the volume resistivity at room temperature was reduced as the comparative example 7, the resistivity at 300° C. was not higher than 1×10$^7$ Ω·cm. The temperature dependency of volume resistivity was large. The activation energy of the temperature dependency was as large as 0.69 eV (25 to 170° C.).

(4) Examples 11 to 14

Tables 4 and 5

Sintered bodies were produced according to substantially the same procedure as the example 1 (Tables 1 and 2), except that Al2O3 powder and SmAlO3 powder were added simultaneously. The properties of each sintered body were then evaluated. Commercial Al2O3 powder having a purity of not lower than 99.9 percent and a mean particle diameter of 1 to 2 μm was used.

Figure 8:
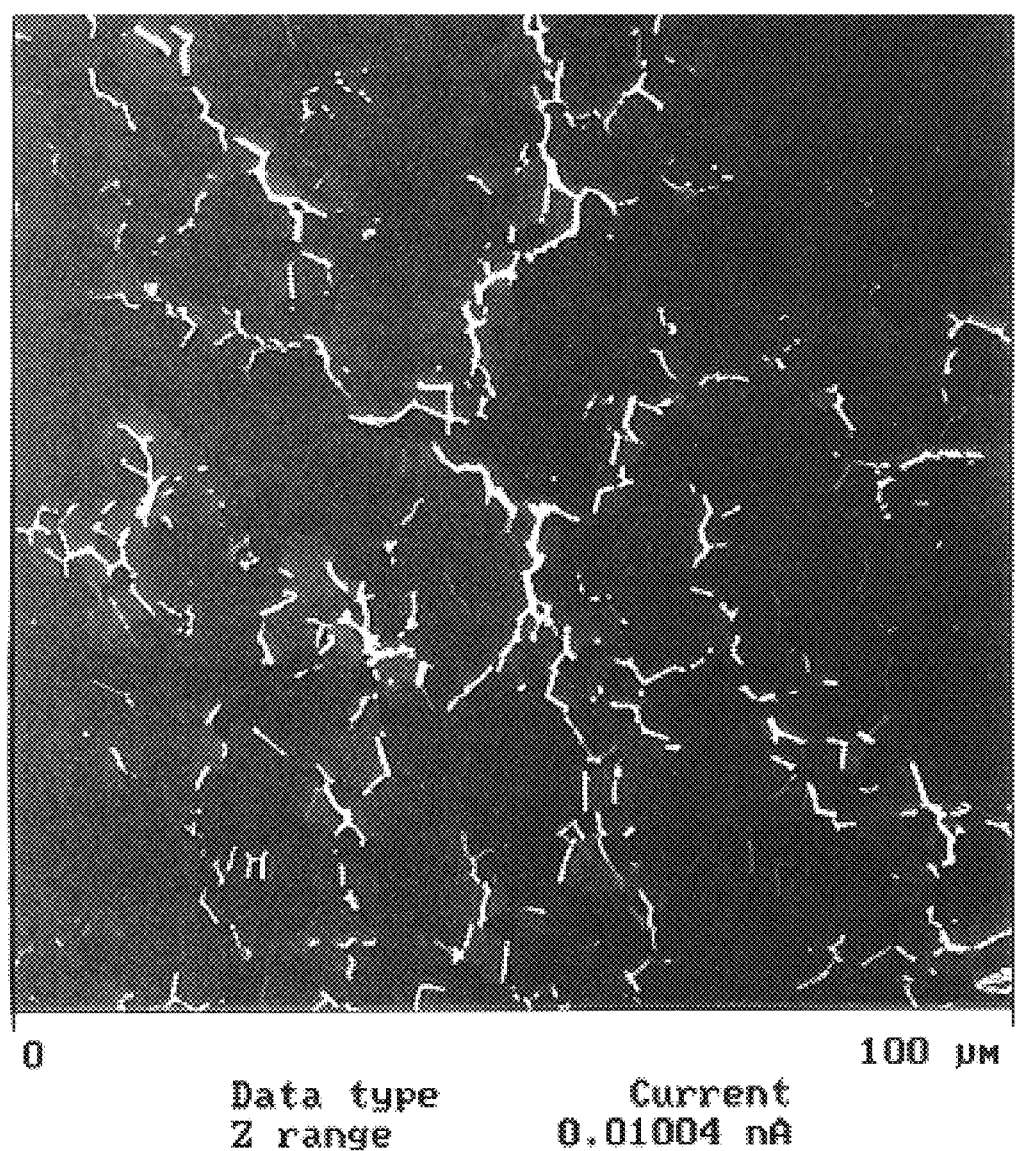
FIG. 8 is a photograph taken by an atomic force microscope showing the current distribution analysis image of the sintered body according to the example 7.
Figure 9:
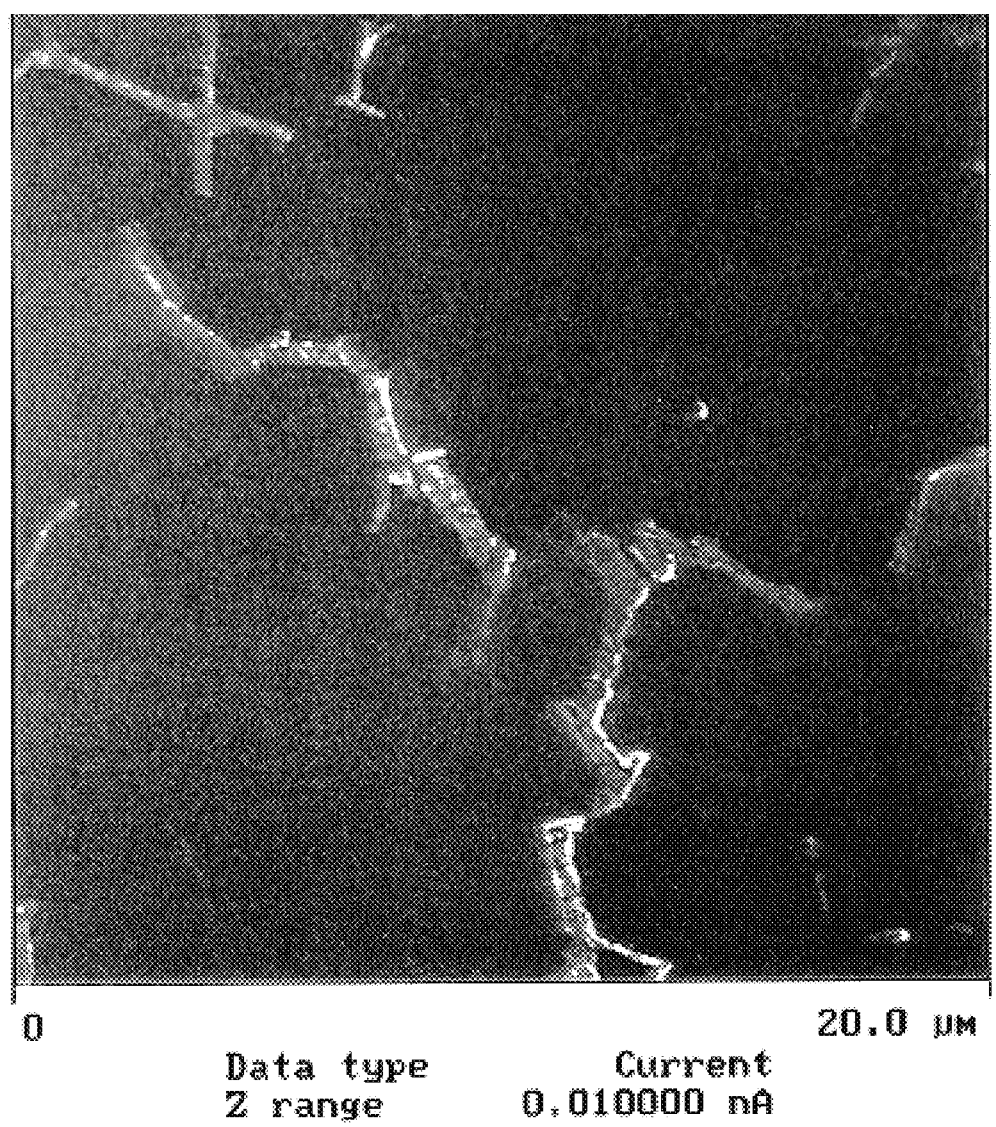
FIG. 9 is a photograph taken by an atomic force microscope showing the current distribution analysis image of the sintered body according to the example 7.
Figure 10:
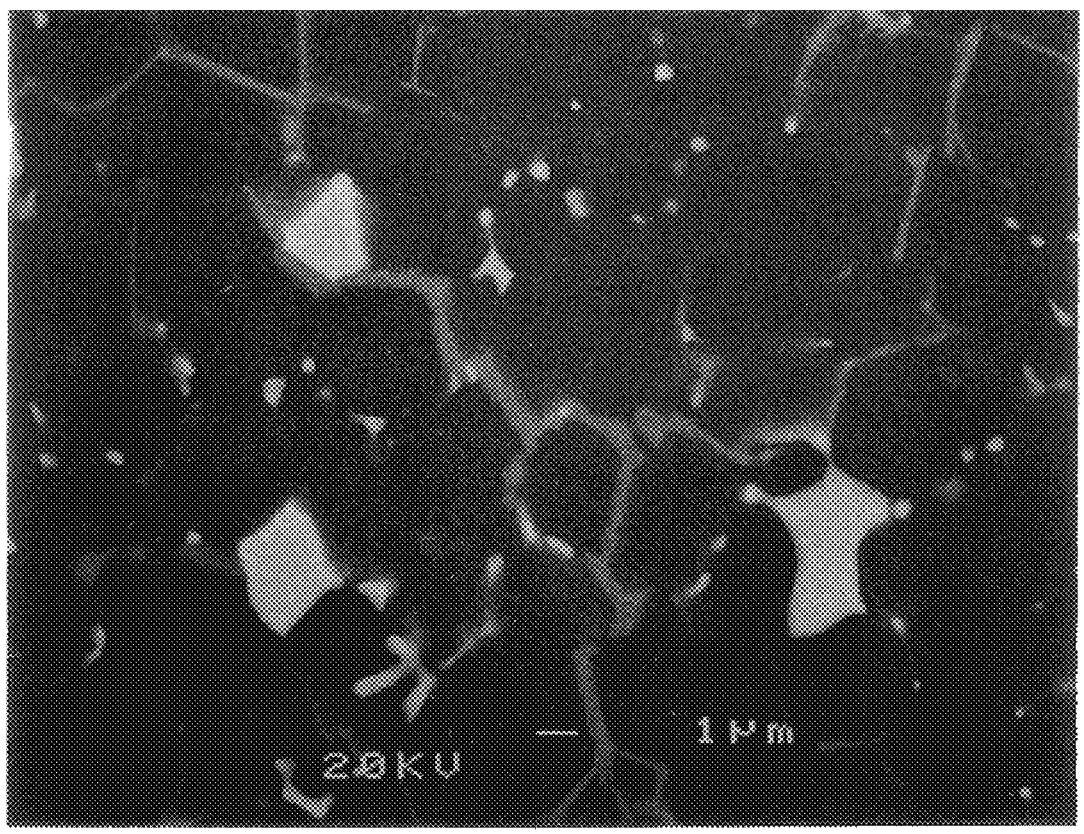
FIG. 10 is a photograph showing a backscattering electron image taken by a scanning electron microscope over the same visual field as FIG. 9.

FIG. 9 shows the current distribution in the central region of the image of FIG. 8. DC bias was +12 V and visual field was 20 μm×20 μm. FIG. 10 shows a backscattering electron image of the same visual field as FIG. 9, as well as crystalline phases obtained by TEM (transmission electron

TABLE 4

| | raw powder | | | sintering | | properties of sintered body | | | | | |
|---|---|---|---|---|---|---|---|---|---|---|---|
| | AlN powder | | | condition | | | | | Sm2O3 | Al2O3 | Sm2O3/ |
| | | oxygen | composition | | sintering | chemical analysis data | | | converted | calculated | Al2O3 |
| | type | content weight % | Sm2O3 mol % | Al2O3 mol % | temperature °C. | O content weight % | Sm content weight % | C content weight % | content mol % | content mol % | molar ratio |
| example 11 | A | 0.97 | 0.58 | 1.11 | 1800 | 2.67 | 2.94 | 0.03 | 0.426 | 1.993 | 0.214 |
| example 12 | B | 0.87 | 0.35 | 0.43 | 1800 | 1.63 | 1.83 | 0.028 | 0.259 | 1.180 | 0.219 |
| example 13 | B | 0.87 | 0.58 | 1.20 | 1800 | 2.68 | 2.94 | 0.033 | 0.426 | 1.999 | 0.213 |
| example 14 | B | 0.87 | 1.13 | 3.04 | 1800 | 4.95 | 5.40 | 0.034 | 0.825 | 3.911 | 0.211 |

TABLE 5

| | properties of sintered body | | | | | | | | |
|---|---|---|---|---|---|---|---|---|---|
| | open porosity % | bulk density g/cm3 | resistivity 25° C. Ω·cm | resistivity 300° C. Ω·cm | activation energy eV | bending strength MPa | thermal conductivity W/mK | average grain diameter of AlN μm | crystalline phase (excluding AlN) |
| example 11 | 0.05 | 3.38 | 1E+10 | 1E+07 | 0.36 | 356 | 92 | 4 | SmAlO3, SmAl11O18 |
| example 12 | 0.02 | 3.33 | 4E+10 | 6E+07 | 0.35 | 390 | 100 | 4 | SmAlO3, SmAl11O18 |
| example 13 | 0.04 | 3.37 | 6E+09 | 1E+07 | 0.34 | 347 | 95 | 4 | SmAlO3, SmAl11O18 |
| example 14 | 0.13 | 3.44 | 2E+09 | 4E+06 | 0.33 | 308 | 83 | 4 | SmAlO3, SmAl11O18 |

In the examples 11 to 14, the ratio ($Sm_2O_3/Al_2O_3$) was about 0.2 in the sintered bodies. The volume resistivity at room temperature of each sintered body was as low as $1\times10^9$ Ω·cm to $1\times10^{11}$ Ω·cm. The activation energies from room temperature to 300° C. were as low as 0.33 to 0.36 eV. The other properties were shown in FIG. 5.

As shown above, when $Al_2O_3$ was added into raw material, it is still possible to attain a low resistivity and low activation energy by adjusting the amount of added $Sm_2O_3$ so that the ratio ($Sm_2O_3/Al_2O_3$) of the sintered body falls within a predetermined range.

(Experiment B)

(Confirmation of Conductive Mechanism and Conductive Path in the Sintered Bodies According to the Invention)

The current distribution analytic images of the sintered body according to the example 7, taken by an atomic force microscope (AFM), were shown in FIGS. 8 and 9. The test sample has a shape of a plate with dimensions of 2 mm×3 mm×0.2 mm. The face of the sample for current distribution analysis was polished. The analysis was carried out using a model "SPM stage D 3100" (probe type "DDESP") supplied by Digital Instruments. The measurement was performed on contact AFM current measurement mode. A direct current (DC) bias was applied on the lower face of the sample and the current distribution on the polished face was measured using the probe.

The DC bias in FIG. 8 was +18 V and the visual field was 100 μm×100 μm. The current is larger in a white and bright region, indicating that the conductivity is high. As can be seen from the figure, current flow forms a kind of network microstructure. Therefore, the microstructure contains network-like continuous phase with a low resistivity.

microscope). According to the TEM analysis, it is confirmed that SmAl11O18 constitutes at least a part of the network microstructure and at least a part of SmAlO3 phase is present as isolated phase.

Conductive mechanism and conductive path in the sintered body according to the example 7 is made clear, by comparing FIGS. 9 and 10 with each other. That is, bright and white regions in the current distribution of FIG. 9 (regions of larger current flow) correspond with $SmAl_{11}O_{18}$ phase constituting the network microstructure formed along intergranular phase shown in FIG. 10. It is thereby confirmed that $SmAl_{11}O_{18}$ phase has a low resistivity and thus forms conductive path. $SmAlO_3$ phase is dark in the current distribution image, indicating a low current and relatively high resistivity.

In the example 7, $SmAl_{11}O_{18}$ phase is continuous along the intergranular phase of AlN grains of the sintered body (along the outer surfaces of the grains), forming a kind of network microstructure. Apparently, if another phase made of a samarium-aluminum complex oxide other than $SmAl_{11}O_{18}$ forms continuous network microstructure, such microstructure contributes to the reduction of volume resistivity of an aluminum nitride sintered body. Such complex oxide includes $(Sm, A) (Al, B)_{11}(O, C)_{18}$. "A" represents an element replacing a part of samarium site, "B" is an element replacing a part of aluminum site, and "C" is an element replacing a part of oxygen site. "A", "B" and "C" include the following elements.

"A" includes the second rare earth element other than samarium as described above. "B" includes Mg, Ga, Ti, Fe, Go, V, Cr, Ni or the like. "C" includes N or the like.

(Experiment C: Examples 15 to 21: Reduction of Lightness of Surface Color of Aluminum Nitride Sintered Body)

Aluminum nitride sintered bodies were produced substantially same as the experiment "A". The formulation of raw material in the examples 15 to 19 was same as that in the example 7. The formulation of raw material in the examples 20 and 21 was same as that in the example 12. TiO2 (a purity of 99.9 percent: a mean particle diameter of not higher than 1 μm) was added to the raw material of each example in a predetermined amount shown in table 6 as a blackening agent. The manufacturing and valuating processes were same as those in the example 7.

Table 6 shows the formulation of raw material, sintering conditions, results of chemical analysis of elements in the sintered body, and the converted contents of metal elements in each sintered body according to each example. Table 7 shows the properties of each of the resulting sintered bodies. In table 6, an amount of added $TiO_2$ is represented as an amount (mole percent) calculated on the provision that total of amounts of AlN, Sm2O3 and Al2O3 is 100 mole percent. The content of Ti in each sintered body was determined by an inductively coupling plasma (ICP) spectrometry. The lightness of the surface color was determined according to "JIS Z 8721".

The surface color of each of aluminum nitride sintered bodies according to the examples 15 to 21 was blackish, uniform, and had a lightness of about N3 to N4. It was possible to prevent color irregularity and to obtain uniform color tone within sintering temperature range of 1800° C. to 1950° C.

The resistivity of each of sintered bodies according to the examples 15 to 21 was similar to that of the sintered body according to the example 7 without TiO2 addition. In other words, each of the above sintered bodies provided a low volume resistivity and low activation energy of temperature dependency of volume resistivity. Although the resistivity was slightly decreased as the sintering temperature becomes higher, the activation energy was not substantially affected.

The strength, thermal conductivity and mean grain diameter of each sintered body were substantially same as those of the inventive sintered body without the addition of the blackening agent. The grain diameter tends to be larger when applying a higher sintering temperature.

Other than AlN phase, SmAlO3 phase and SmAl11O18 phase were identified as Sm containing phases, and TiN phase was identified as Ti containing phase. An unidentified small peak was distinguished.

TABLE 6

| | | composition of raw powder | | | sintering | chemical analysis data of sintered body | | | |
|---|---|---|---|---|---|---|---|---|---|
| | AlN powder | Sm2O3 | Al2O3 | TiO2 | condition | O | | | |
| Example | type | oxygen content weight % | Added Amount mol % | Added Amount mol % | Added Amount mol % | sintering temperature ° C. | oxygen content weight % | Sm content weight % | Ti content weight % | C content weight % |
| 15 | B | 0.87 | 0.23 | — | 0.05 | 1800 | 0.98 | 1.41 | 0.056 | 0.031 |
| 16 | B | 0.87 | 0.23 | — | 0.05 | 1900 | 0.69 | 1.06 | 0.054 | 0.029 |
| 17 | B | 0.87 | 0.23 | — | 0.26 | 1800 | 1.14 | 1.44 | 0.28 | 0.03 |
| 18 | B | 0.87 | 0.23 | — | 0.26 | 1900 | 0.86 | 1.07 | 0.27 | 0.028 |
| 19 | B | 0.87 | 0.23 | — | 0.26 | 1950 | 0.74 | 0.91 | 0.26 | 0.027 |
| 20 | B | 0.87 | 0.35 | 0.43 | 0.25 | 1800 | 1.65 | 1.92 | 0.26 | 0.029 |
| 21 | B | 0.87 | 0.35 | 0.43 | 0.25 | 1900 | 1.42 | 1.62 | 0.26 | 0.028 |

| Example | Sm2O3 converted content mol % | Al2O3 calculated content mol % | TiN converted content mol % | Sm2O3/Al2O3 molar ratio |
|---|---|---|---|---|
| 15 | 0.198 | 0.666 | 0.050 | 0.298 |
| 16 | 0.148 | 0.455 | 0.047 | 0.325 |
| 17 | 0.204 | 0.807 | 0.249 | 0.252 |
| 18 | 0.150 | 0.605 | 0.238 | 0.248 |
| 19 | 0.127 | 0.520 | 0.228 | 0.244 |
| 20 | 0.276 | 1.209 | 0.235 | 0.228 |
| 21 | 0.231 | 1.038 | 0.233 | 0.223 |

TABLE 7 properties of sintered body

| example | open porosity (%) | bulk density g/cm3 | resistivity (25° C.) Ω·cm | resistivity (300° C.) Ω·cm | activation energy eV | bending strength MPa | thermal conductivity W/mK | average grain diameter of AlN μm | color tone (lightness) | crystalline phase (excluding AlN) |
|---|---|---|---|---|---|---|---|---|---|---|
| 15 | 0.01 | 3.30 | 4E+11 | 4E+08 | 0.37 | 441 | 104 | 4 | black (N-4) | SmAlO3, SmAl11O18,TiN |
| 16 | 0.02 | 3.28 | 6E+10 | 8E+07 | 0.35 | 385 | 126 | 6 | black (N-4) | SmAlO3, SmAl11O18,TiN |
| 17 | 0.04 | 3.30 | 5E+10 | 1E+08 | 0.33 | 455 | 101 | 4 | black (N-3) | SmAlO3, SmAl11O18,TiN |
| 18 | 0.03 | 3.29 | 3E+10 | 7E+07 | 0.32 | 472 | 117 | 6 | black (N-4) | SmAlO3, SmAl11O18,TiN |
| 19 | 0.03 | 3.28 | 1E+10 | 2E+07 | 0.33 | 415 | 123 | 7 | black (N-4) | SmAlO3, SmAl11O18,TiN |
| 20 | 0.01 | 3.33 | 2E+10 | 3E+07 | 0.35 | 443 | 99 | 4 | black (N-4) | SmAlO3, SmAl11O18,TiN |
| 21 | 0.04 | 3.30 | 9E+09 | 2E+07 | 0.33 | 376 | 102 | 6 | black (N-4) | SmAlO3, SmAl11O18,TiN |

It was confirmed that the Ti containing phase was present in intergranular phase between AlN particles as isolated phase with a diameter of not higher than 3 μm, based on the analysis of microstructure by EPMA and backscattering electron images. The distribution of Ti containing phase within the Sm intergranular phase, as well as that within the AlN particles, were not determined. The distribution of Sm containing phase was substantially same as that in FIG. 6, forming network microstructure along the intergranular phase between the AlN particles.

(Experiment "D": Examples 22 to 33 and Comparative Examples 9 and 10: The Effects of the Addition of a Second Rare Earth Element Other than Samarium)

Commercial powder of $Y_2O_3$, $La_2O_3$, $CeO_2$, $Gd_2O_3$, $Dy_2O_3$, $Er_2O_3$, or $Yb_2O_3$ (each powder has a purity of not lower than 99.9 percent and a mean particle diameter of not higher than 2 μm) was used as a source of second rare earth element. The above reduction nitriding powder "B" was used as AlN powder. $Sm_2O_3$ powder used was the same as that in the experiment "A".

Each powder was weighed according to the compositions shown in Table 8, and then each raw mixed powder was produced, shaped and sintered to obtain each sintered body, which was then evaluated, according to the same procedure in the experiment "A". The molar ratios of AlN powder, $Sm_2O_3$ powder and powder of the second rare earth oxide were calculated ignoring the content of impurities. Table 8 also shows each sintering temperature.

The basic compositions of AlN and $Sm_2O_3$ and the sintering condition in the examples 22 to 25 and 27 to 33 were the same as those in the example 6. The basic compositions and sintering condition in the example 26 were the same as those in the example 7. That is, each second rare earth element was added to the formulation of each example 6 or 7 and sintered under the same condition to provide the sintering body of each of the examples 22 to 33. Table 8 also shows the compositions (chemical analysis data) of the sintering body of each example.

TABLE 8

| | composition of raw powder | | | | sintering condition | properties of sintered body (composition) chemical analysis data (weight %) | | | |
|---|---|---|---|---|---|---|---|---|---|
| | | | complex additive | | sintering | | | content of | |
| | AlN mol % | Sm2O3 mol % | type | content mol % | temperature ° C. | O content | Sm content | second rare earth element | carbon content |
| example 22 | 99.832 | 0.117 | Yb2O3 | 0.050 | 1750 | 0.94 | 0.57 | 0.40 | 0.031 |
| example 23 | 99.832 | 0.117 | Yb2O3 | 0.050 | 1800 | 0.90 | 0.59 | 0.41 | 0.030 |
| example 24 | 99.870 | 0.117 | CeO2 | 0.012 | 1800 | 0.92 | 0.63 | 0.042 | 0.029 |
| example 25 | 99.782 | 0.117 | CeO2 | 0.100 | 1800 | 1.05 | 0.59 | 0.32 | 0.029 |
| example 26 | 99.666 | 0.234 | CeO2 | 0.100 | 1850 | 1.06 | 1.19 | 0.33 | 0.028 |
| example 27 | 99.832 | 0.117 | Y2O3 | 0.051 | 1800 | 0.89 | 0.59 | 0.21 | 0.029 |
| example 28 | 99.866 | 0.117 | La2O3 | 0.017 | 1800 | 0.89 | 0.60 | 0.10 | 0.030 |
| example 29 | 99.833 | 0.117 | Gd2O3 | 0.050 | 1800 | 0.91 | 0.62 | 0.37 | 0.030 |
| example 30 | 99.832 | 0.117 | Dy2O3 | 0.050 | 1750 | 0.93 | 0.60 | 0.38 | 0.031 |
| example 31 | 99.832 | 0.117 | Dy2O3 | 0.050 | 1800 | 0.84 | 0.55 | 0.35 | 0.029 |
| example 32 | 99.833 | 0.117 | Er2O3 | 0.050 | 1750 | 0.93 | 0.61 | 0.40 | 0.031 |
| example 33 | 99.833 | 0.117 | Er2O3 | 0.050 | 1800 | 0.87 | 0.58 | 0.39 | 0.030 |
| comparative example 9 | 99.650 | 0.117 | CeO2 | 0.233 | 1800 | 1.150 | 0.660 | 0.770 | 0.029 |
| comparative example 10 | 99.184 | 0.117 | CeO2 | 0.699 | 1800 | 1.490 | 0.720 | 2.290 | 0.031 |

TABLE 9

| | Sm2O3 converted content mol % | converted content of second rare earth oxide mol % | Al2O3 converted content mol % | AlN mol % | Sm2O3/ Al2O3 molar ratio | oxide of second rare earth element/ Sm2O3, molar ratio | oxides of all the rare earth elements/ Al2O3 molar ratio |
|---|---|---|---|---|---|---|---|
| example 22 | 0.079 | 0.048 | 0.691 | 99.181 | 0.11 | 0.61 | 0.18 |
| example 23 | 0.082 | 0.050 | 0.652 | 99.216 | 0.13 | 0.60 | 0.20 |
| example 24 | 0.087 | 0.013 | 0.704 | 99.197 | 0.12 | 0.14 | 0.14 |
| example 25 | 0.082 | 0.096 | 0.769 | 99.053 | 0.11 | 1.16 | 0.23 |
| example 26 | 0.166 | 0.099 | 0.696 | 99.038 | 0.24 | 0.60 | 0.38 |
| example 27 | 0.082 | 0.049 | 0.643 | 99.226 | 0.13 | 0.60 | 0.20 |
| example 28 | 0.083 | 0.015 | 0.675 | 99.227 | 0.12 | 0.18 | 0.15 |
| example 29 | 0.086 | 0.049 | 0.657 | 99.207 | 0.13 | 0.57 | 0.21 |
| example 30 | 0.083 | 0.049 | 0.678 | 99.190 | 0.12 | 0.59 | 0.20 |
| example 31 | 0.076 | 0.045 | 0.609 | 99.269 | 0.13 | 0.59 | 0.20 |
| example 32 | 0.085 | 0.050 | 0.676 | 99.189 | 0.13 | 0.59 | 0.20 |
| example 33 | 0.081 | 0.049 | 0.628 | 99.243 | 0.13 | 0.60 | 0.21 |
| comparative example 9 | 0.092 | 0.231 | 0.761 | 98.916 | 0.12 | 2.50 | 0.42 |
| comparative example 10 | 0.102 | 0.698 | 0.758 | 98.443 | 0.13 | 6.83 | 1.06 |

In the column "compositions of sintered body", the contents of $Sm_2O_3$, the rare earth oxide and $Al_2O_3$ were calculated based on the contents obtained by chemical analysis of Sm, rare earth element and oxygen, according to the following procedure.

(Content of Sm2O3: Mole Percent)

The content of Sm is determined by ICP analysis and then converted to the content of Sm2O3.

(Converted Content of Second Rare Earth Element Calculated as Oxide)

The content of a rare earth element (Re) is determined by ICP analysis. The content is then converted to the content of Re2O3. When the rare earth element is cerium, the content of cerium is converted to the content of CeO2.

(Content of Al2O3)

The total content of oxygen in the sintered body is determined by infrared absorptiometry. Both of the oxygen contents in Sm2O3 and in the second rare earth oxide were subtracted from the total content of oxygen to calculate the remaining oxygen. The content of Al2O3 was calculated under the provision that all the remaining oxygen atoms constitute Al2O3.

(Content of AlN: Mole Percent)

The contents of Sm2O3, the oxide of the second rare earth element and Al2O3 calculated as described above were subtracted from 100 (mole percent) to provide the content of AlN. Each content of each component was represented using "mole percent" as a unit. This calculation is performed under the provision that total of the contents of AlN, Sm2O3, Al2O3 and the oxide of the second rare earth element is 100 mole percent.

(Ratio of the Second Rare Earth Element/Sm2O3)

The molar ratio of the content of the oxide of the second rare earth element (converted amount as the oxide) to the content of Sm2O3 (converted content as the oxide) was calculated.

(Ratio of Total of Contents of all the Rare Earth Oxides/Al2O3)

The molar ratio of total of the contents of all the rare earth oxides to the content of Al2O3 was calculated.

and 30 and comparative examples 9 and 10, as representative samples showing resistivity change at a high temperature range. It is thereby possible to properly operate an electrostatic chuck within a wide temperature range of about 60 to 500° C., when the sintered body of the example 30 is used as a substrate of the chuck.

Further, the properties of the sintered bodies according to the examples 22 to 33 were compared with those of the bodies according to the examples 6 and 7 without the addition of the second rare earth element.

When Yb2O3 was added (examples 22 and 33), or Dy2O3 was added (examples 30 and 31), or Er2O3 was added (examples 32 and 33), the resistivity may be slightly increased and the strength may be improved, by adding 0.04 to 0.05 mole percent of the rare earth oxide. Especially in the examples 22, 30 and 32, it was possible to lower the sintering temperature to 1750° C. and to obtain a dense body still maintaining a mean grain diameter at about 3 $\mu$m. It was thereby possible to attain a strength higher than 520 MPa.

When La2O3 was added (example 28), the content of La2O3 was 0.015 mole percent, the molar ratio of the content of La2O3/content of Sm2O3 was 0.18 and the volume resistivity was $4 \times 10^{12}$ $\Omega \cdot$cm. It was thereby possible to increase the volume resistivity by adding a smaller amount of the second rare earth element compared with the compositions with the other second rare earth element added. Moreover, the thus obtained sintered body has a strength higher than 500 MPa.

It is also possible to slightly increase the resistivity by adding CeO2 (examples 24, 25 and 26) or Y2O3 (example 27), as the other formulations.

In each of the above examples, the thermal conductivity of the sintered body is not lower than 100 W/mK and exhibits a high thermal conductivity.

TABLE 10

| | open porosity % | bulk density g/cm3 | resistivity 25° C. $\Omega \cdot$cm | resistivity 300° C. $\Omega \cdot$cm | activation energy eV | bending strength MPa | thermal conductivity W/mK | average grain diameter of AlN $\mu$m | crystalline phase (excluding AlN) |
|---|---|---|---|---|---|---|---|---|---|
| example 22 | 0.01 | 3.29 | 6.E+11 | 5.E+08 | 0.38 | 539 | 103 | 3 | SmAlO3, SmAl11O18,Yb3Al5O12 |
| example 23 | 0.02 | 3.29 | 2.E+11 | 2.E+08 | 0.37 | 501 | 107 | 4 | SmAlO3, SmAl11O18,Yb3Al5O12 |
| example 24 | 0.01 | 3.28 | 2.E+11 | 3.E+08 | 0.35 | 452 | 98 | 4 | SmAlO3, SmAl11O18 |
| example 25 | 0.02 | 3.29 | 3.E+12 | 2.E+09 | 0.39 | 420 | 103 | 4 | SmAlO3, SmAl11O18 |
| example 26 | 0.03 | 3.31 | 3.E+12 | 2.E+09 | 0.39 | 448 | 118 | 5 | SmAlO3, SmAl11O18 |
| example 27 | 0.01 | 3.28 | 1.E+12 | 1.E+09 | 0.37 | 448 | 111 | 4 | SmAlO3, SmAl11O18,Y3Al5O12 |
| example 28 | 0.02 | 3.28 | 4E+12 | 3E+09 | 0.39 | 512 | 101 | 4 | SmAlO3, SmAl11O18 |
| example 29 | 0.04 | 3.29 | 5.E+12 | 3.E+09 | 0.40 | 429 | 106 | 4 | SmAlO3, SmAl11O18 |
| example 30 | 0.03 | 3.29 | 5.E+12 | 4.E+09 | 0.38 | 525 | 100 | 3 | SmAlO3, SmAl11O18 |
| example 31 | 0.01 | 3.29 | 7.E+12 | 4.E+09 | 0.40 | 494 | 108 | 4 | SmAlO3, SmAl11O18 |
| example 32 | 0.02 | 3.29 | 1.E+12 | 2.E+09 | 0.33 | 521 | 102 | 3 | SmAlO3, SmAl11O18,Er3Al5O12 |
| example 33 | 0.03 | 3.29 | 2.E+12 | 2.E+09 | 0.37 | 506 | 114 | 4 | SmAlO3, SmAl11O18,Er3Al5O12 |
| Comparative example 9 | 0.01 | 3.30 | 1.E+14 | 4.E+09 | 0.54 | 427 | 104 | 4 | SmAlO3, SmAl11O18 |
| Comparative example 10 | 0.02 | 3.33 | 1.E+16 | 2.E+11 | 0.58 | 343 | 107 | 4 | SmAlO3 |

Aluminum nitride sintered bodies according to the examples 22 to 33 have low volume resistivities not higher than $1 \times 10^{13}$ $\Omega \cdot$cm at room temperature and the differences of the resistivities at room temperature and 300° C. were small. Low activation energies not higher than 0.4 eV were also obtained.

The sintered bodies according to the comparative examples 9 and 10 contained large amounts of the second rare earth elements forming complex oxides, providing a higher volume resistivity and a higher activation energy of temperature dependency of the resistivity.

Figure 11:
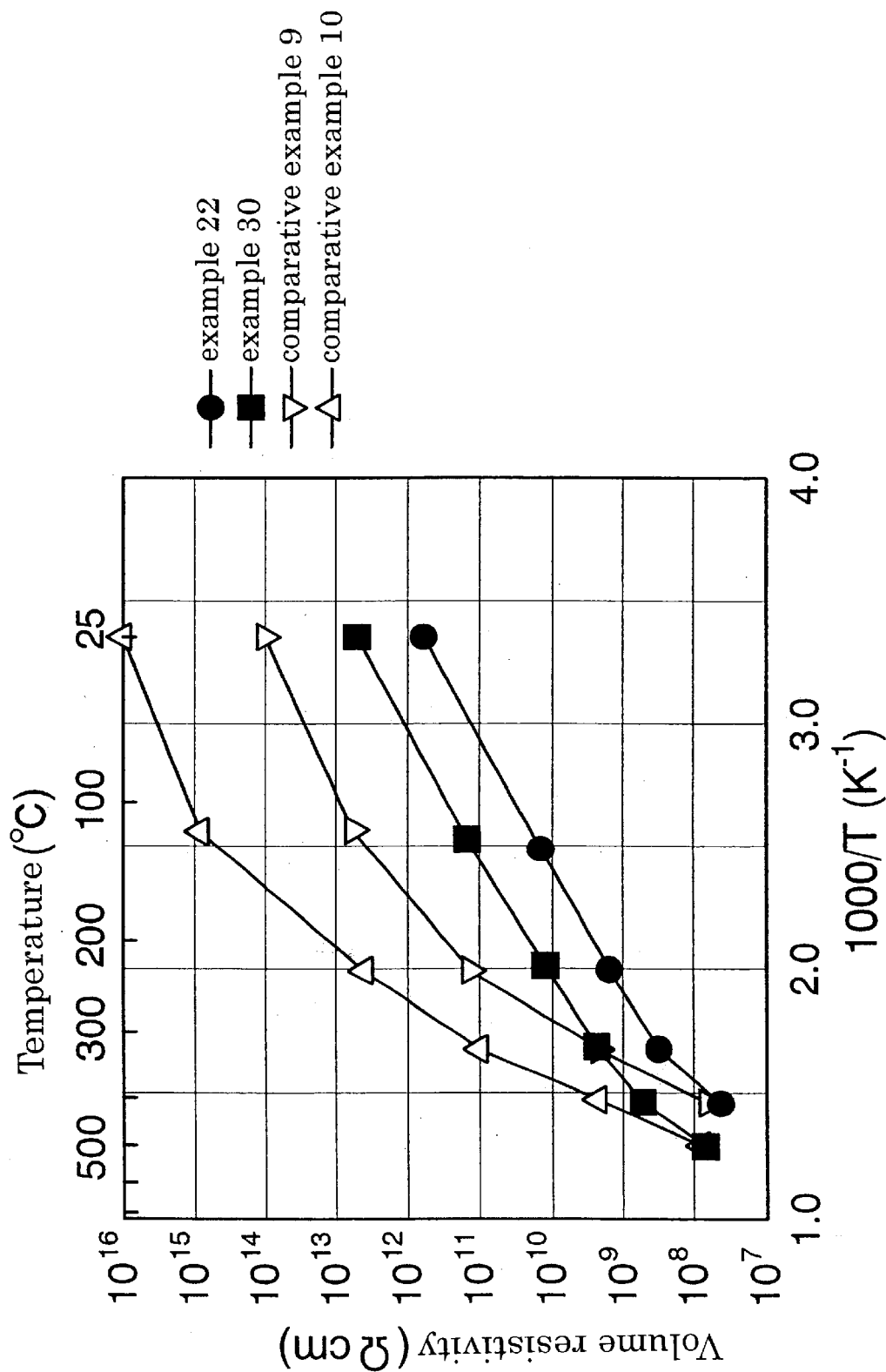
FIG. 11 is a graph showing the temperature dependency of volume resistivity of each of the sintered bodies according to examples 22 and 30 and comparative examples 9 and 10.

FIG. 11 shows the temperature dependency of volume resistivity of the sintered body in each of the examples 22

SmAl11O18 phase and SmAlO3 phase were identified as the intergranular phase, in addition to the main phase (AlN phase), in each of the above sintered bodies. In some examples, a trace amount of a crystalline phase of Re3Al5O12 type (Re is a rare earth element) was identified.

In the intergranular phase of each sintered body according to the examples 22 to 33, the distribution of the elements was substantially same as that shown in FIG. 6, and Sm containing phase is formed along the intergranular phase between AlN particles, forming network microstructure.

Figure 12:
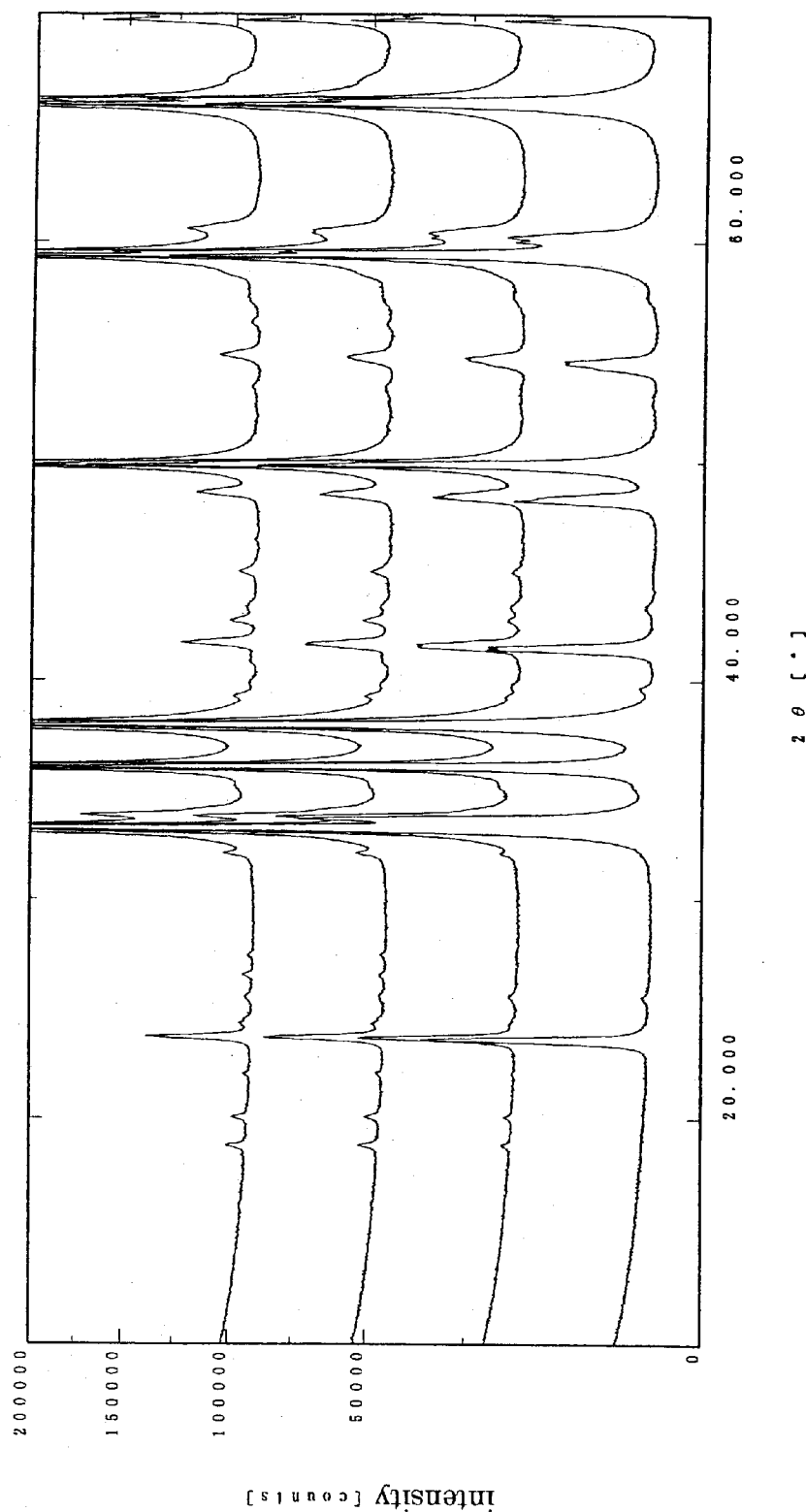
FIG. 12 is an X-ray diffraction profile of the sintered bodies according to the examples 24 and 25 and comparative examples 9 and 10.

FIG. 12 shows X-ray diffraction profiles of the sintered bodies according to the examples 24 and 25 and comparative examples 9 and 10. In the examples 24 and 25 and comparative examples 9 and 10, as shown in table 8, the amount of Sm2O3 was maintained constantly and the amount of CeO2 is increased stepwise when formulating the raw mixed powder. In FIG. 12, the diagrams of the examples 24, 25, and comparative examples 9, 10 were arranged vertically in series. Peak "C" is a representative peak of SmAl11O18 phase and peak "D" is a representative peak of SmAlO3 phase. Cuα ray and current of 50 kV and 300 mA were used.

FIGS. 13, 14, 15 and 16 show backscattering electron images of polished surfaces of the sintered bodies according to the examples 24 and 25 and comparative examples 9 and 10. The brighter the image is, the larger the content of atoms with large atomic numbers. Therefore, a larger amount of samarium atoms or the second rare earth atoms are present in a brighter region in the image.

Figure 13:
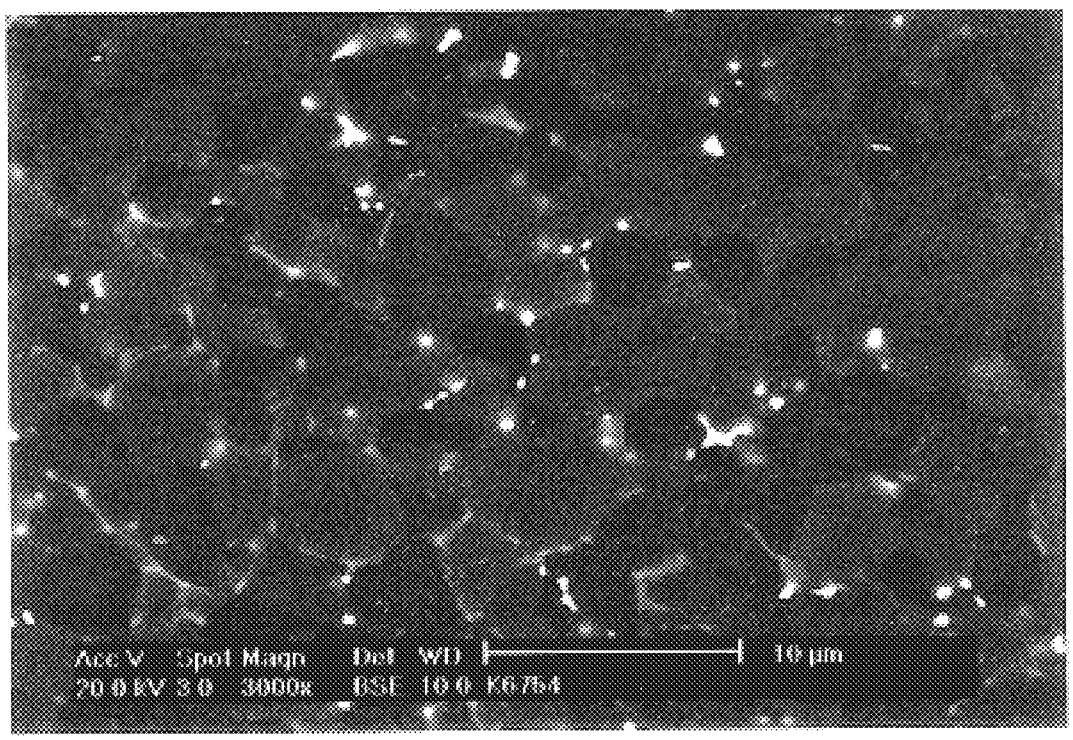
FIG. 13 shows a backscattering electron image of a polished surface of the sintered body according to the example 24.

In FIG. 13, blackish particles are identified as AlN particles. The intergranular phase is composed of the two phases: white and dispersed (isolated) phase, and gray, elongate and continuous phase mainly constituting network microstructure. It is considered that the white and dispersed phase is mainly composed of SmAlO3 phase, by comparing the distribution of lightness in intergranular phase and FIG. 12. The gray and elongate intergranular phase, mainly constituting network microstructure, has a lightness lower than that of the dispersed phase, indicating that the contents of Sm and the other rare earth element are lower. It is therefore considered that the elongate and network shaped phase is mainly composed of SmAl11O18 phase.

Figure 14:
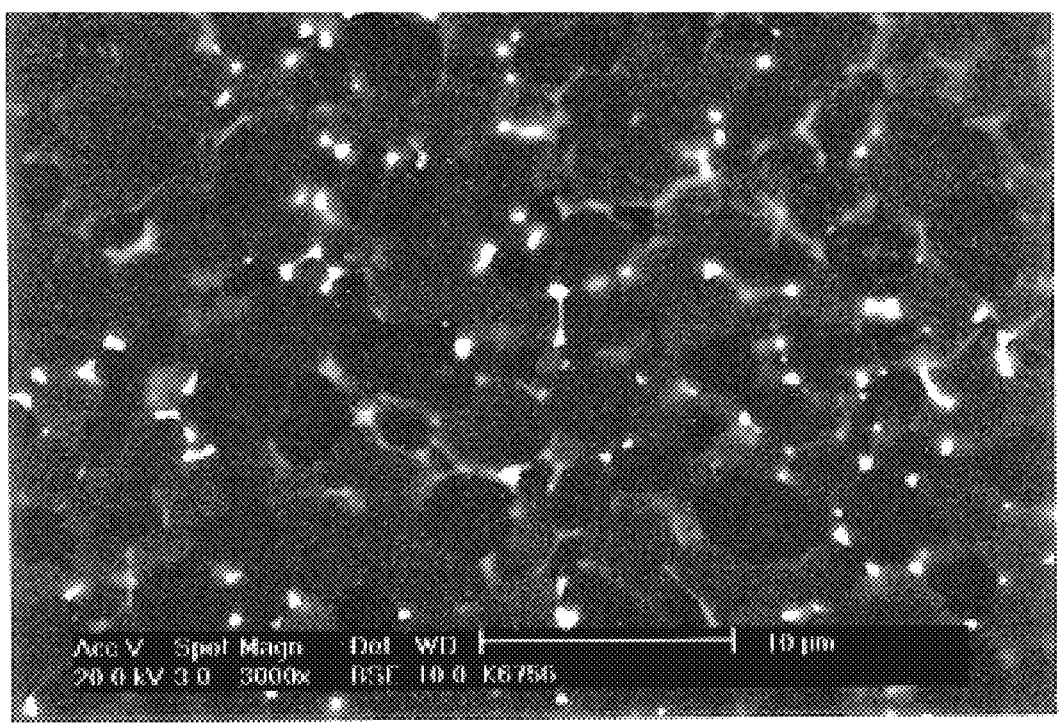
FIG. 14 shows a backscattering electron image of a polished surface of the sintered body according to the example 25.

The network microstructure, same as that shown in FIG. 13, may be recognized in FIG. 14 (example 25). Further, SmAl11O18 phase and SmAlO3 phase may be identified in X-ray diffraction diagram of FIG. 12.

Figure 15:
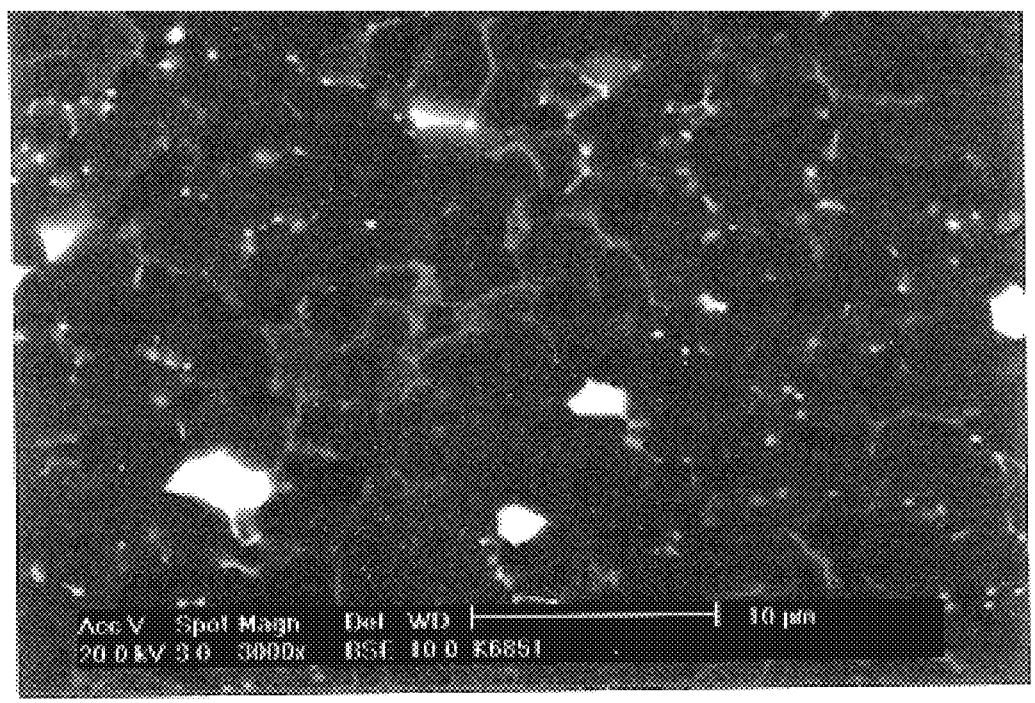
FIG. 15 shows a backscattering electron image of a polished surface of the sintered body according to the comparative example 9.
Figure 16:
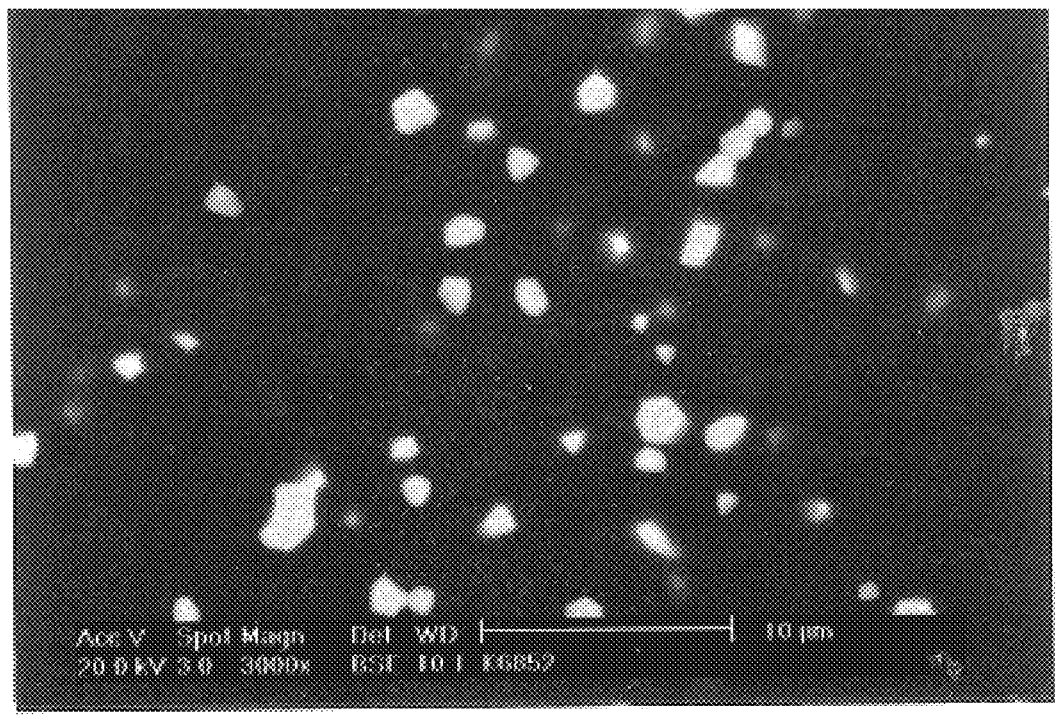
FIG. 16 shows a backscattering electron image of a polished surface of the sintered body according to the comparative example 10.

In FIG. 15 (comparative example 9), the amount of cerium was increased. In the example, intergranular particles with a high lightness are grown to form large particles and are unevenly distributed. The gray and elongate continuous phase is almost diminished. Consequently, the network microstructure shown in FIGS. 13 and 14 may not be easily recognized. Responsive to this change, in X-ray diffraction diagram in FIG. 12, the strengths of characteristic peaks of SmAlO3 phase are slightly increased and the strengths of characteristic peaks of SmAl11O18 phase are considerably decreased. Such tendency is more clear in the comparative example 10 corresponding with FIGS. 12 and 16. The intergranular phase is composed of white and isolated phase (SmAlO3) without any network microstructure (SmAl11O18).

It is speculated that the characteristic properties of the sintered body according to the invention are provided through the following mechanism.

(Fine Adjustment of Volume Resistivity)

The reason of the increase of volume resistivity by the addition of a second rare earth element is not clearly understood. A part of the added rare earth element might replace a part of Sm atoms of SmAl11O18 phase and be dissolved into the phase to slightly change the properties. That is, the dissolved rare earth element might trap electrons working as carriers. Alternatively, the rare earth element might reduce non-stoichiometric property in Sm site or oxygen site so as to reduce defects and thus carriers.

(Improvement of Strength)

The fracture of the aluminum nitride sintered body with the second rare earth oxide added mainly takes place along the intergranular phase. It is considered that the second rare earth element is dissolved into the Sm—Al—O intergranular phase to improve the strength of the intergranular phase, so that the overall strength of the body is improved.

(Densification of the Sintered Body is Possible at a Lower Sintering Temperature)

In some compositions, it is possible to realize sufficient densification at a lower sintering temperature by adding a second rare earth element. It is considered that SmAl11O18 may be converted to liquid phase at a lower temperature, thus contributing to the reduction of sintering temperature, by simultaneously adding the second rare earth element.

As described above, it is possible to provide a material with a low volume resistivity at room temperature composed of an aluminum nitride sintered body.

What is claimed is:

1. A material having a volume resistivity at room temperature of not higher than $1 \times 10^{13}$ Ω·cm, said material being composed of an aluminum nitride sintered body containing samarium in a converted content calculated as samarium oxide of not lower than 0.04 mole percent, said sintered body containing aluminum nitride phase and samarium-aluminum complex oxide phase, wherein said sintered body comprises aluminum nitride grains having a mean diameter of not lower than 3 μm.

2. The material of claim 1, wherein said samarium-aluminum complex oxide phase contains $SmAl_{11}O_{18}$ phase.

3. The material of claim 1, wherein the molar ratio of said converted content of samarium calculated as samarium oxide to a calculated content of aluminum oxide ($Sm_2O_3/Al_2O_3$) is 0.05 to 0.5.

4. The material of claim 1, wherein said sintered body has an activation energy of temperature dependency of volume resistivity from room temperature to 300° C. of not higher than 0.4 eV.

5. The material of claim 1, wherein said samarium-aluminum complex oxide phase forms a network microstructure.

6. The material of claim 2, wherein said $SmAl_{11}O_{18}$ phase forms a network microstructure.

7. The material of claim 1, wherein said sintered body has a lightness of not higher than N4 measured according to JIS Z8721.

8. The material of claim 1, wherein said sintered body contains one or more metal elements selected from the group consisting of metal elements belonging to groups IVA, VA, VIA, VIIA and VIIIA of the Periodic Table, and in a content calculated as a metal element of not lower than 0.01 weight percent.

9. The material of claim 1, wherein said sintered body contains at least one second rare earth element other than samarium, and wherein the molar ratio of a converted content of said second rare earth element calculated as a rare earth oxide to said converted content of samarium calculated as samarium oxide is not higher than 2.0.

10. The material of claim 9, wherein the molar ratio of a total of the converted contents of all of the rare earth elements calculated as rare earth oxides to a calculated content of aluminum oxide is 0.05 to 0.5.

11. An aluminum nitride sintered body containing samarium in a converted content calculated as samarium oxide of not lower than 0.04 mole percent, said sintered body containing aluminum nitride phase and $SmAl_{11}O_{18}$ phase, wherein said aluminum nitride sintered body comprises aluminum nitride grains with a mean diameter of not lower than 3 μm.

12. The sintered body of claim 11, wherein said $SmAl_{11}O_{18}$ phase forms a network microstructure.

13. The sintered body of claim 11, wherein said sintered body has a volume resistivity at room temperature of not higher than $1 \times 10^{13}$ Ω·cm.

14. The sin ere body of claim 11, further comprising at least one second rare earth element other than samarium, wherein the molar ratio of a converted content of said second rare earth element calculated as a rare earth oxide to said converted content of samarium calculated as samarium oxide is not higher than 2.0.

15. The sintered body of claim 14, wherein the molar ratio of a total of the converted contents of all of the rare earth elements calculated as rare earth oxides to a calculated content of aluminum oxide is 0.05 to 0.5.

16. The sintered body of claim 14, wherein said second rare earth element is one or more elements selected from the group consisting of yttrium, lanthanum, cerium, gadolinium, dysprosium, erbium and ytterbium.

17. The sintered body of claim 14, further comprising a phase of a complex oxide of said second rare earth element and aluminum.

18. The sintered body of claim 11, further comprising $SmAlO_3$ phase.

19. The sintered body of claim 11, wherein the molar ratio of said converted content of samarium calculated as samarium oxide to a calculated content of aluminum oxide ($Sm_2O_3/Al_2O_3$) is 0.05 to 0.5.

20. The sintered body of claim 11, wherein said sintered body has a lightness of not higher than N4 measured according to JIS Z8721.

21. The sintered body of claim 11, further comprising one or more transition metal elements selected from the group consisting of metal elements belonging to groups IVA, VA, VIA, VIIA and VIIIA of the Periodic Table, and in a content calculated as a metal element of not lower than 0.01 weight percent.

22. The sintered body of claim 21, wherein said transition metal element is present in a content calculated as a metal element of not higher than 1.0 weight percent.

23. The sintered body of claim 21, further comprising a crystalline phase of the nitride of said transition metal element.

24. The sintered body of claim 11, wherein said sintered body has an activation energy of temperature dependency of volume resistivity from room temperature to 300° C. of not higher than 0.4 eV.

25. An aluminum nitride sintered body containing samarium in a converted content calculated as samarium oxide of not lower than 0.04 mole percent, said sintered body containing aluminum nitride phase and samarium-aluminum complex oxide phase with network microstructure, wherein said aluminum nitride sintered body comprises aluminum nitride grains with a mean diameter of not lower than 3 µm.

26. The sintered body of claim 25, wherein said sintered body has a volume resistivity at room temperature of not higher than $1\times10^{13}$ Ω·cm.

27. The sintered body of claim 25, wherein said samarium-aluminum complex oxide phase comprises $SmAl_{11}O_{18}$ phase with a network microstructure.

28. The sintered body of claim 25, further comprising at least one second rare earth element other than samarium, wherein the molar ratio of a converted content of said second rare earth element calculated as a rare earth oxide to said converted content of samarium calculated as samarium oxide is not higher than 2.0.

29. The sintered body of claim 28, wherein the molar ratio of a total of the converted contents of all of the rare earth elements calculated as rare earth oxides to a calculated content of aluminum oxide is 0.05 to 0.5.

30. The sintered body of claim 28, wherein said second rare earth element is one or more elements selected from the group consisting of yttrium, lanthanum, cerium, gadolinium, dysprosium, erbium and ytterbium.

31. The sintered body of claim 28, further comprising a phase of a complex oxide of said second rare earth element and aluminum.

32. The sintered body of claim 25, further comprising $SmAlO_3$ phase.

33. The sintered body of claim 25, wherein the molar ratio of said converted content of samarium calculated as samarium oxide to a calculated content of aluminum oxide ($Sm_2O_3/Al_2O_3$) is 0.05 to 0.5.

34. The sintered body of claim 25, wherein said sintered body has a lightness of not higher than N4 measured according to JIS Z8721.

35. The sintered body of claim 25, further comprising one or more transition metal elements selected from the group consisting of metal elements belonging to groups IVA, VA, VIA, VIIA and VIIIA of the Periodic Table, and in a content calculated as a metal element of not lower than 0.01 weight percent.

36. The sintered body of claim 35, wherein said transition metal element is present in a content calculated as a metal element of not higher than 1.0 weight percent.

37. The sintered body of claim 35, further comprising a crystalline phase of the nitride of said transition metal element.

38. The sintered body of claim 25, wherein said sintered body has an activation energy of temperature dependency of volume resistivity from room temperature to 300° C. of not higher than 0.4 eV.

39. An aluminum nitride sintered body comprising samarium in a converted content calculated as samarium oxide of not lower than 0.04 mole percent and at least one second rare earth element other than samarium, wherein the molar ratio of a converted content of said second rare earth element calculated as a rare earth oxide to said converted content of samarium calculated as samarium oxide is not higher than 2.0, wherein said aluminum nitride sintered body comprises aluminum nitride grains with a mean diameter of not lower than 3 µm.

40. The sintered body of claim 39, wherein the molar ratio of a total of the converted contents of all of the rare earth elements calculated as rare earth oxides to a calculated content of aluminum oxide is 0.05 to 0.5.

41. The sintered body of claim 39, wherein said second rare earth element is one or more elements selected from the group consisting of yttrium, lanthanum, cerium, gadolinium, dysprosium, erbium and ytterbium.

42. The sintered body of claim 39, further comprising a phase of a complex oxide of said second rare earth element and aluminum.

43. The sintered body of claim 39, further comprising aluminum nitride phase and samarium-aluminum complex oxide phase.

44. The sintered body of claim 43, wherein said samarium-aluminum complex oxide phase comprises $SmAl_{11}O_{18}$ phase.

45. The sintered body of claim 43, wherein said samarium-aluminum complex oxide phase forms a network microstructure.

46. The sintered body of claim 39, wherein said sintered body has a volume resistivity at room temperature of not higher than $1\times10^{13}$ Ω·cm.

47. The sintered body of claim 39, further comprising $SmAlO_3$ phase.

48. The sintered body of claim 39, the molar ratio of said converted content of samarium calculated as samarium oxide to a calculated content of aluminum oxide ($Sm_2O_3/Al_2O_3$) is 0.05 to 0.5.

49. The sintered body of claim 39, wherein said sintered body has a lightness of not higher than N4 measured according to JIS Z8721.

50. The sintered body of claim 39, comprising one or more transition metal elements selected from the group consisting of metal elements belonging to groups IVA, VA, VIA, VIIA and VIIIA of the Periodic Table, and in a content calculated as a metal element of not lower than 0.01 weight percent.

51. The sintered body of claim 50, wherein said transition metal element is present in a content calculated as a metal element of not higher than 1.0 weight percent.

52. The sintered body of claim 50, further comprising a crystalline phase of the nitride of said transition metal element.

53. The sintered body of claim 39, wherein said sintered body has an activation energy of temperature dependency of volume resistivity from room temperature to 300° C. of not higher than 0.4 eV.

54. A member used for the production of semiconductors, wherein at least a part of said member is made of an aluminum nitride sintered body containing samarium, and said sintered body contains aluminum nitride grains with a mean diameter of not lower than 3 μm.

55. The member of claim 54, wherein said sintered body has a volume resistivity at room temperature of not lower than $1 \times 10^8$ Ω·cm and not higher than $1 \times 10^{13}$ Ω·cm.

56. The member of claim 54, wherein said sintered body contains samarium in a converted content calculated as samarium oxide of not lower than 0.04 mole percent and aluminum nitride phase and samarium-aluminum complex oxide phase.

57. The member of claim 56, wherein said samarium-aluminum complex oxide phase comprises a $SmAl_{11}O_{18}$ phase.

58. The member of claim 56, wherein said samarium-aluminum complex oxide phase forms a network microstructure.

59. The member of claim 54, wherein said aluminum nitride sintered body contains samarium in a converted content calculated as samarium oxide of not lower than 0.04 mole percent and at least one second rare earth element other than samarium, and wherein the molar ratio of a converted content of said second rare earth element calculated as a rare earth oxide to said converted content of samarium calculated as samarium oxide is not higher than 2.0.

60. The member of claim 59, wherein the molar ratio of a total of the converted contents of all of the rare earth elements calculated as rare earth oxides to a calculated content of aluminum oxide is 0.05 to 0.5.

61. The member of claim 59, wherein said second rare earth element is one or more elements selected from the group consisting of yttrium, lanthanum, cerium, gadolinium, dysprosium, erbium and ytterbium.

62. The member of claim 59, further comprising a crystalline phase of a complex oxide of said second rare earth element and aluminum.

63. The member of claim 54, wherein the molar ratio of said converted content of samarium calculated as samarium oxide to a calculated content of aluminum oxide ($Sm_2O_3/Al_2O_3$) is 0.05 to 0.5.

64. The member of claim 54, wherein said sintered body has an activation energy of temperature dependency of volume resistivity from room temperature to 300° C. of not higher than 0.4 eV.

65. The member of claim 54, further comprising a substrate made of said aluminum nitride sintered body and a metal member embedded in said substrate.

66. The member of claim 65, wherein said metal member comprises at least an electrode for an electrostatic chuck.

67. The member of claim 54, wherein said sintered body has a lightness of not higher than N4 measured according to JIS Z8721.

68. The member of claim 54, wherein said sintered body contains one or more transition metal elements selected from the group consisting of metal elements belonging to group IVA, VA, VIA, VIIA and VIIIA of the Periodic Table, and in a content calculated as a metal element of not lower than 0.01 weight percent.

69. The member of claim 67, wherein said sintered body contains said transition metal element in a content calculated as a metal element of not higher than 1.0 weight percent.

70. The member of claim 68, wherein said sintered body contains a crystalline phase of the nitride of said transition metal element.

71. A material having a volume resistivity at room temperature of not higher than $1 \times 10^{13}$ Ω·cm, said material being composed of an aluminum nitride sintered body containing samarium in a converted content calculated as samarium oxide of not lower than 0.04 mole percent, said sintered body containing aluminum nitride phase and samarium-aluminum complex oxide phase,
wherein said aluminum nitride sintered body contains one or more metal elements selected from the group consisting of metal elements belonging to groups IVA, VA, VIA, VIIA and VIIIA of the Periodic Table, and in a content calculated as a metal element of not lower than 0.01 weight percent.

72. An aluminum nitride sintered body containing samarium in a converted content calculated as samarium oxide of not lower than 0.04 mole percent, said sintered body containing aluminum nitride phase and $SmAl_{11}O_{18}$ phase,
wherein said aluminum nitrided sintered body comprises one or more transition metal elements selected from the group consisting of metal elements belonging to groups IVA, VA, VIA, VIIA and VIIIA of the Periodic Table, and in a content calculated as a metal element of not lower than 0.01 weight percent.

73. An aluminum nitride sintered body containing samarium in a converted content calculated as samarium oxide of not lower than 0.04 mole percent, said sintered body containing aluminum nitride phase and samarium-aluminum complex oxide phase with network microstructure,
wherein said aluminum nitride sintered body comprises one or more transition metal elements selected from the group consisting of metal elements belonging to groups IVA, VA, VIA, VIIA and VIIIA of the Periodic Table, and in a content calculated as a metal element of not lower than 0.01 weight percent.

74. An aluminum nitride sintered body comprising samarium in a converted content calculated as samarium oxide of not lower than 0.04 mole percent and at least one second rare earth element other than samarium, wherein the molar ratio of a converted content of said second rare earth element calculated as a rare earth oxide to said converted content of samarium calculated as samarium oxide is not higher than 2.0,
wherein said aluminum nitride sintered body comprises one or more transition metal elements selected from the group consisting of metal elements belonging to groups IVA, VA, VIA, VIIA and VIIIA of the Periodic Table, and in a content calculated as a metal element of not lower than 0.01 weight percent.

75. A member used for the production of semiconductors, wherein at least a part of said member is made of an aluminum nitride sintered body containing samarium, wherein said sintered body contains one or more transition metal elements selected from the group consisting of metal elements belonging to groups IVA, VA, VIA, VIIA and VIIIA of the Periodic Table, and in a content calculated as a metal element of not lower than 0.01 weight percent.

* * * * *

UNITED STATES PATENT AND TRADEMARK OFFICE
CERTIFICATE OF CORRECTION

PATENT NO. : 6,607,836 B2
DATED : August 19, 2003
INVENTOR(S) : Yuji Katsuda et al.

It is certified that error appears in the above-identified patent and that said Letters Patent is hereby corrected as shown below:

Column 4,
Line 31, please delete "Substitute specification para-"; and
Line 32, please delete "graphs".

Column 6,
Line 39, please delete "OR;".

Column 25,
Line 1, please change "sin ere" to -- sintered --.

Column 27,
Line 6, please insert -- further -- before "comprising".

Signed and Sealed this

Twenty-first Day of October, 2003

JAMES E. ROGAN
*Director of the United States Patent and Trademark Office*

(12) EX PARTE REEXAMINATION CERTIFICATE (5576th)
United States Patent
Katsuda et al.

(10) Number: US 6,607,836 C1
(45) Certificate Issued: Oct. 17, 2006

(54) MATERIAL OF LOW VOLUME RESISTIVITY, AN ALUMINUM NITRIDE SINTERED BODY AND A MEMBER USED FOR THE PRODUCTION OF SEMICONDUCTORS

(75) Inventors: Yuji Katsuda, Aichi-Prefecture (JP); Jun Yoshikawa, Aichi-Prefecture (JP); Masaaki Masuda, Aichi-Prefecture (JP); Chikashi Ihara, Aichi-Prefecture (JP)

(73) Assignee: NGK Insulators, Ltd., Nagoya (JP)

Reexamination Request:
No. 90/007,415, Feb. 10, 2005

Reexamination Certificate for:
Patent No.: 6,607,836
Issued: Aug. 19, 2003
Appl. No.: 09/982,484
Filed: Oct. 18, 2001

Certificate of Correction issued Oct. 21, 2003.

Related U.S. Application Data

(60) Provisional application No. 60/297,224, filed on Jun. 8, 2001.

(30) Foreign Application Priority Data

Oct. 23, 2000 (JP) .................................... 2000-322615
Jun. 7, 2001 (JP) .................................... 2001-173088
Sep. 4, 2001 (JP) .................................... 2001-267588

(51) Int. Cl.
*C04B 35/581* (2006.01)
*H01L 23/00* (2006.01)

(52) U.S. Cl. .................. 428/469; 428/471; 428/697; 428/698; 428/702; 501/98.4; 501/98.6; 501/152; 501/153

(58) Field of Classification Search ................. None
See application file for complete search history.

(56) References Cited

U.S. PATENT DOCUMENTS

| 5,705,450 | A | 1/1998 | Chiao |
| 5,993,699 | A | 11/1999 | Katsuda et al. |
| 5,998,321 | A | 12/1999 | Katsuda et al. |
| 6,225,249 | B1 | 5/2001 | Fujita et al. |

FOREIGN PATENT DOCUMENTS

| JP | 63-46032 | * | 9/1988 |
| JP | 07-165473 | | 6/1995 |
| JP | 10-158002 | | 6/1998 |
| JP | 10-338574 | | 12/1998 |
| JP | 11-100270 | | 4/1999 |
| JP | 11-157937 | | 6/1999 |
| JP | 2000-86345 | | 3/2000 |

* cited by examiner

*Primary Examiner*—Kiley Stoner

(57) ABSTRACT

A material with a low volume resistivity at room temperature composed of an aluminum nitride sintered body is provided. The sintered body contains samarium in a converted content calculated as samarium oxide of not lower than 0.04 mole percent. The sintered body contains an aluminum nitride phase and a samarium-aluminum complex oxide phase. The samarium-aluminum complex oxide phase forms intergranular layers with a low resistivity along the intergranular phase between aluminum nitride grains.

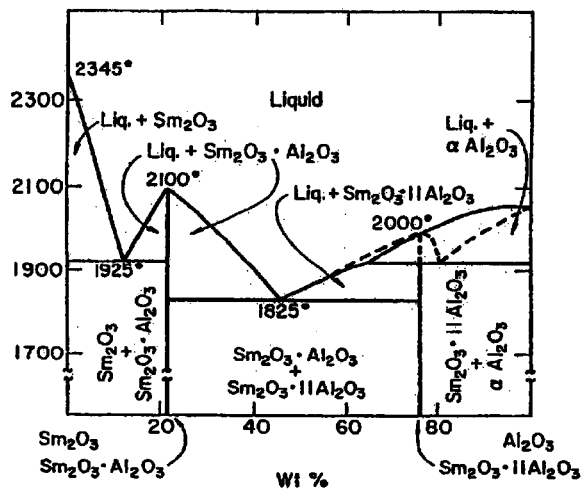

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 71–75 is confirmed.

Claims 1–7, 9–10, 12, 25–34, 38–49, 53 and 56–58 are cancelled.

Claims 8, 11, 21, 35, 50, 54, 68 and 69 are determined to be patentable as amended.

Claims 13–20, 22–24, 36–37, 51–52, 55, 59–67 and 70, dependent on an amended claim, are determined to be patentable.

8. [The material of claim 1.] *A material having a volume resistivity at room temperature of not higher than $1\times10^{13}$ $\Omega\cdot cm$, said material being composed of an aluminum nitride sintered body containing samarium in a converted content calculated as samarium oxide of not lower than 0.04 mol. %, said sintered body containing aluminum nitride phase and samarium-aluminum complex oxide phase, wherein said sintered body comprises aluminum nitride grains having a mean diameter of not lower than 3 μm, and* wherein said sintered body contains one or more metal elements selected from the group consisting of metal elements belonging to groups IVA, VA, VIA, VIIA and VIIIA of the Periodic Table, and in a content calculated as a metal element of not lower than 0.01 wt %.

11. An aluminum nitride sintered body containing samarium in a converted content calculated as samarium oxide of not lower than 0.04 mol. %, said sintered body containing aluminum nitride phase and $SmAl_{11}O_{18}$ phase, wherein said aluminum nitride sintered body comprises aluminum nitride grains with a mean diameter of not lower than 3 μm, *and wherein said $SmAl_{11}O_{18}$ phase forms a network microstructure*.

21. [The sintered body of claim 11, further comprising] *An aluminum nitride sintered body containing samarium in a converted content calculated as samarium oxide of not lower than 0.04 mol. %, said sintered body containing aluminum nitride phase and $SmAl_{11}O_{18}$ phase, wherein said aluminum nitride sintered body comprises aluminum nitride grains with a mean diameter of not lower than 3 μm, and wherein said aluminum nitride sintered body comprises* one or more transition metal elements selected from the group consisting of metal elements belonging to groups IVA, VA, VIA, VIIA and VIIIA of the Periodic Table, and in a content calculated as a metal element of not lower than 0.01 wt %.

35. [The sintered body of claim 25, further comprising] *An aluminum nitride sintered body containing samarium in a converted content calculated as samarium oxide of not lower than 0.04 mol. %, said sintered body containing aluminum nitride phase and samarium-aluminum complex oxide phase with a network microstructure, wherein said aluminum nitride sintered body comprises aluminum nitride grains with a mean diameter of not lower than 3 μm, and wherein said aluminum nitride sintered body comprises* one or more transition metal elements selected from the group consisting of metal elements belonging to groups IVA, VA, VIA, VIIA and VIIIA of the Periodic Table, and in a content calculated as a metal element of not lower than 0.01 weight percent.

50. [The sintered body of claim 39, further comprising] *An aluminum nitride sintered body comprising samarium in a converted content calculated as samarium oxide of not lower than 0.04 mol. % and at least one second rare earth element other than samarium, wherein the molar ratio of a converted content of said second rare earth element calculated as a rare earth oxide to said converted content of samarium calculated as samarium oxide is not higher than 2.0, wherein said aluminum nitride sintered body comprises aluminum nitride grains with a mean diameter of not lower than 3 μm, and wherein said aluminum nitride sintered body comprises* one or more transition metal elements selected from the group consisting of metal elements belonging to groups IVA, VA, VIA, VIIA and VIIIA of the Periodic Table, and in a content calculated as a metal element of not lower than 0.01 wt %.

54. A member used for the production of semiconductors, wherein at least a part of said member is made of [an] *said* aluminum nitride sintered body [containing samarium, and said sintered body contains aluminum nitride grains with a mean diameter of not lower than 3 μm] *of claim 11*.

68. [The member of claim 54.] *A member used for the production of semiconductors, wherein at least a part of said member is made of an aluminum nitride sintered body containing samarium, wherein said sintered body contains aluminum nitride grains with a mean diameter of not lower than 3 μm, and* wherein said sintered body contains one or more transition metal elements selected from the group consisting of metal elements belonging to group IVA, VA, VIA, [VILA] *VIIA* and VIIIA of the Periodic Table, and in a content calculated as a metal element of not lower than 0.01 wt. %.

69. The member of claim [67] *68*, wherein said sintered body contains said transition metal element in a content calculated as a metal element of not higher than 1.0 wt %.

* * * * *